(12) United States Patent
Chae et al.

(10) Patent No.: US 10,228,586 B2
(45) Date of Patent: Mar. 12, 2019

(54) COLOR FILTER AND DISPLAY DEVICE INCLUDING THE SAME

(71) Applicant: SAMSUNG DISPLAY CO., LTD., Yongin-si, Gyeonggi-do (KR)

(72) Inventors: Seungyeon Chae, Yongin-si (KR); Sikwang Kim, Yongin-si (KR); Jooyoung Yoon, Yongin-si (KR); Sungyoung Choi, Yongin-si (KR); Sehee Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/680,607

(22) Filed: Aug. 18, 2017

(65) Prior Publication Data

US 2018/0088404 A1  Mar. 29, 2018

(30) Foreign Application Priority Data

Sep. 28, 2016  (KR) .................. 10-2016-0125098

(51) Int. Cl.
| | |
|---|---|
| G02F 1/1335 | (2006.01) |
| H01L 27/32 | (2006.01) |
| H01L 51/52 | (2006.01) |
| H01L 51/56 | (2006.01) |

(52) U.S. Cl.
CPC .. *G02F 1/133514* (2013.01); *G02F 1/133617* (2013.01); *H01L 27/322* (2013.01); *G02F 1/133512* (2013.01); *G02F 1/133516* (2013.01); *G02F 2001/133614* (2013.01); *G02F 2202/108* (2013.01); *G02F 2202/36* (2013.01); *H01L 27/3211* (2013.01); *H01L 27/3244* (2013.01); *H01L 51/5284* (2013.01); *H01L 51/56* (2013.01)

(58) Field of Classification Search
CPC ......... G02F 1/133514; G02F 1/133617; H01L 27/322
See application file for complete search history.

(56) References Cited

U.S. PATENT DOCUMENTS

| | | | |
|---|---|---|---|
| 2004/0233139 A1* | 11/2004 | Asano ................... | G02B 5/201 345/76 |
| 2007/0291335 A1* | 12/2007 | Lee ....................... | G02B 5/201 358/512 |
| 2014/0078451 A1* | 3/2014 | Lou ................... | G02F 1/133512 349/96 |
| 2015/0177584 A1 | 6/2015 | Shi | |
| 2015/0200380 A1 | 7/2015 | Huang et al. | |
| 2015/0318404 A1 | 11/2015 | Ishigaki et al. | |
| 2018/0031909 A1* | 2/2018 | Liu .................. | G02F 1/133516 |

FOREIGN PATENT DOCUMENTS

| | | |
|---|---|---|
| JP | 2016122606 A | 7/2016 |
| KR | 1020160000569 A | 1/2016 |
| KR | 1020160056335 A | 5/2016 |

* cited by examiner

*Primary Examiner* — Lucy P Chien
(74) *Attorney, Agent, or Firm* — Cantor Colburn LLP

(57) ABSTRACT

A color filter includes a substrate including a pixel area and a light-blocking area surrounding the pixel area, a color conversion layer above the pixel area and converting incident light into light of different color, and a color filter layer including a first portion between the color conversion layer and the substrate, and a second portion surrounding side surfaces of the color conversion layer, and selectively transmitting the light of different color.

19 Claims, 14 Drawing Sheets

COLOR FILTER AND DISPLAY DEVICE INCLUDING THE SAME

This application claims priority to Korean Patent Application No. 10-2016-0125098, filed on Sep. 28, 2016, and all the benefits accruing therefrom under 35 U.S.C. § 119, the content of which in its entirety is herein incorporated by reference.

BACKGROUND

1. Field

One or more exemplary embodiments relate to a color filter, a display device including the color filter, and a method of manufacturing the color filter.

2. Description of the Related Art

A liquid-crystal display ("LCD") device is a widely-used display device including a liquid-crystal layer where orientation of liquid-crystal particles varies according to an electric field applied thereto. The LCD device displays an image by controlling polarization of incident light through the liquid-crystal layer.

The LCD device uses a color filter so as to form a color, and in this regard, when white light emitted from a backlight source passes through each of red, green, and blue color filters, emission intensity is reduced to about ⅓ of its original emission intensity due to each of the red, green, and blue color filters, and thus, luminescent efficiency deteriorates.

In order to supplement the deterioration in the luminescent efficiency and to achieve high image reproduction, a photo-luminescent LCD ("PL-LCD") device, in which a conventional color filter in the LCD device has been replaced with a quantum dot color conversion layer ("QD-CCL"), is provided. The PL-LCD device displays a color image by visible light that is generated when light with a low frequency band such as ultraviolet light or blue light, which is generated by the backlight source and is controlled through the liquid-crystal layer, is emitted to the QD-CCL.

SUMMARY

A color conversion layer ("CCL") does not transmit a portion of light emitted from a light source, unlike a color filter, but generates, from the light emitted from the light source, light having a different wavelength, so that the light emitted from the CCL is emitted in various directions. In addition, a portion of light emitted from the light source may not be converted in the CCL but may changelessly pass through the CCL. Therefore, a problem may occur since light having a first color which is emitted from a CCL may be mixed with another light that has a second color and is emitted from another CCL adjacent to the CCL or another light that has a third color and is emitted from a light source, and thus color mixing may occur. Due to the color mixing, color reproduction may deteriorate.

Various exemplary embodiments provide a color filter and a display device including the color filter, in which color reproduction may be improved while a manufacturing process thereof is simplified.

Additional exemplary embodiments will be set forth in part in the description which follows and, in part, will be apparent from the description, or may be learned by practice of the presented exemplary embodiments.

According to one or more exemplary embodiments, a color filter includes a substrate including a first pixel area and a light-blocking area surrounding the first pixel area, a first color conversion layer above the first pixel area and converting incident light into a first color light, and a first color filter layer including a first portion between the first color conversion layer and the substrate, and a second portion surrounding side surfaces of the first color conversion layer, and selectively transmitting the first color light.

In an exemplary embodiment, the first color conversion layer may include first quantum dots that emit the first color light that is excited by the incident light and thus has a wavelength longer than that of the incident light.

In an exemplary embodiment, the color filter may further include a light-blocking layer between the substrate and the second portion.

In an exemplary embodiment, the color filter may further include an upper color filter layer above the first color conversion layer and the first color filter layer, and reflecting the first color light and selectively transmitting the incident light.

In an exemplary embodiment, the substrate may include a second pixel area separated from the first pixel area by the light-blocking area, and the upper color filter layer arranged above the second pixel area and on a sidewall of the second portion adjacent to the second pixel area.

In an exemplary embodiment, the first portion and the second portion may be unitary.

In an exemplary embodiment, the incident light may be one of blue light and ultraviolet light, and a first color of the first color light may be one of a red color and a green color.

In an exemplary embodiment, the color filter may further include a second color conversion layer above a second pixel area of the substrate and converting the incident light into second color light different from the first color light, and a second color filter layer including a first portion between the second color conversion layer and the substrate and a second portion surrounding side surfaces of the second color conversion layer, and selectively transmitting the second color light.

In an exemplary embodiment, the first color filter layer may block transmission of the second color light, and the second color filter layer may block transmission of the first color light.

In an exemplary embodiment, the color filter may further include a third color conversion layer above a third pixel area of the substrate and converting the incident light into third color light different from the first color light and the second color light, and a third color filter layer including a first portion between the third color conversion layer and the substrate and a second portion surrounding side surfaces of the third color conversion layer, and selectively transmitting the third color light.

According to one or more exemplary embodiments, a method of manufacturing a color filter may include arranging a substrate including a first pixel area and a light-blocking area surrounding the first pixel area. The method may include disposing, on the substrate, a first material layer capable of selectively transmitting a first color light. The method may include disposing, by removing portions of the first material layer, a first color filter layer including a first portion on the first pixel area and a second portion on the light-blocking area, the second portion having a thickness greater than that of the first portion. The method may include disposing, on the first portion, a first color conversion layer capable of converting incident light into the first color light.

In an exemplary embodiment, the first color conversion layer may be disposed on the first portion of the first color conversion layer by an inkjet coating method.

In an exemplary embodiment, the method may further include disposing a light-blocking layer on the light-blocking area.

In an exemplary embodiment, the method may further include disposing, above the first color conversion layer and the first color filter layer, an upper color filter layer capable of reflecting the first color light and selectively transmitting the incident light.

In an exemplary embodiment, the upper color filter layer may be disposed above a second pixel area of the substrate and on a sidewall of the second portion adjacent to the second pixel area.

A second material layer capable of selectively transmitting a second color light may be disposed on the substrate. By removing portions of the second material layer, a second color filter layer that includes a first portion on a second pixel area of the substrate and a second portion on the light-blocking area, the second portion of the second color filter layer having a thickness greater than that of the first portion of the second color filter layer may be disposed. A second color conversion layer capable of converting the incident light into the second color light may be disposed on the first portion of the second color filter layer.

According to one or more exemplary embodiments, a display device may include a display including first and second pixels, and a color filter above the display, and including first and second pixel areas arranged to overlap the first and second pixels, respectively. The color filter may include a substrate including the first and second pixel areas, a first color conversion layer above the first pixel area and converting incident light into a first color light, a second color conversion layer above the second pixel area and converting the incident light into a second color light, a first color filter layer including a first portion between the first color conversion layer and the substrate, and a second portion surrounding side surfaces of the first color conversion layer, and selectively transmitting the first color light, and a second color filter layer including a first portion between the second color conversion layer and the substrate and a second portion surrounding side surfaces of the second color conversion layer, and selectively transmitting the second color light.

In an exemplary embodiment, the display device may further include a backlight unit emitting the incident light to the color filter, and a liquid-crystal layer between the display and the color filter.

Each of the first and second pixels may include an organic emission layer capable of emitting the incident light.

BRIEF DESCRIPTION OF THE DRAWINGS

These and/or other exemplary embodiments will become apparent and more readily appreciated from the following description of the exemplary embodiments, taken in conjunction with the accompanying drawings, in which.

DETAILED DESCRIPTION

Figure 1:
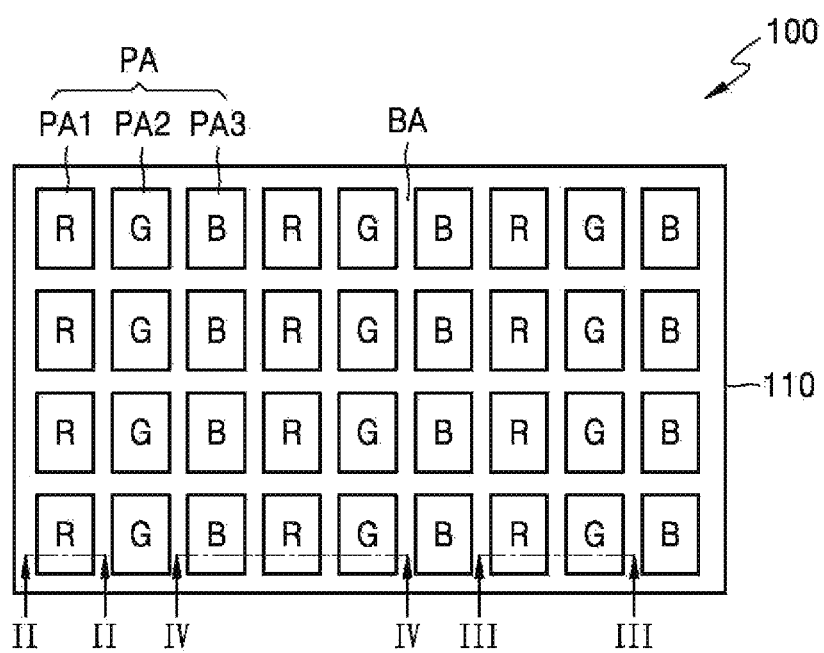
FIG. 1 is a plan view of an exemplary embodiment of a color filter.

As the disclosure allows for various changes and numerous exemplary embodiments, particular exemplary embodiments will be illustrated in the drawings and described in detail in the written description. Effects and features of the disclosure and methods of accomplishing the same may be understood more readily by reference to the following detailed description of preferred exemplary embodiments and the accompanying drawings. The disclosure may, however, be embodied in many different forms and should not be construed as being limited to the exemplary embodiments set forth herein.

Reference will now be made in detail to exemplary embodiments, examples of which are illustrated in the accompanying drawings, where functions or constructions that are not related to descriptions are not described in detail since they would obscure the invention with unnecessary detail, components that are the same or are in correspondence are rendered the same reference numeral regardless of the figure number, and redundant explanations are omitted.

It will be understood that when a layer, a region, an area, an element, or the like is referred to as being "on" another layer, region, area, or element, the layer, region, area, or element can be directly on another layer, region, area, or element or intervening layer, region, area, or element may also be present.

In the drawings, the thicknesses of layers and regions are exaggerated for clarity. For example, the thicknesses and sizes of elements in the drawings are arbitrarily shown for convenience of description, thus, the spirit and scope of the disclosure are not necessarily defined by the drawings.

Throughout the specification, it will also be understood that when a layer, a region, an area, an element, or the like is referred to as being "connected to" or "coupled with" another layer, region, area, or element, it can be directly connected to or coupled with the other layer, region, area, or element, or it can be electrically connected to or coupled with the other layer, region, area, or element by having an intervening layer, region, area, or element interposed therebetween.

While such terms as "first," "second," etc., may be used to describe various components, such components must not be limited to the above terms. The above terms are used only to distinguish one component from another. Throughout the specification, an expression used in the singular encompasses the expression of the plural, unless it has a clearly different meaning in the context. When a part "includes" or "comprises" an element, unless there is a particular description contrary thereto, the part can further include other elements, not excluding the other elements.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Expressions such as "at least one of," when preceding a list of elements, modify the entire list of elements and do not modify the individual elements of the list.

Figure 2:
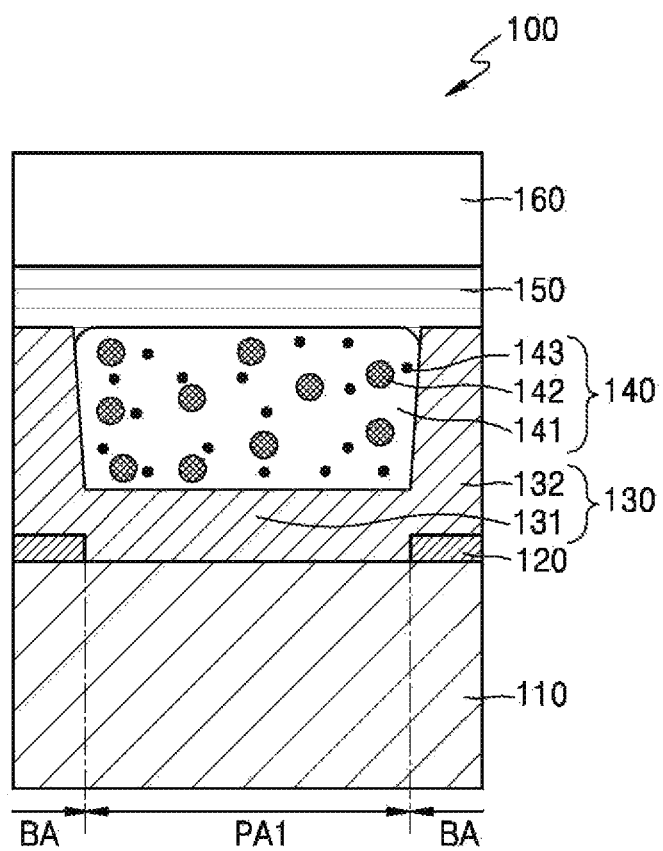
FIG. 2 is a cross-sectional view of the color filter.

FIG. 1 is a plan view of a color filter 100, according to an exemplary embodiment. FIG. 2 is a cross-sectional view of the color filter 100, taken along line II-II of FIG. 1.

Referring to FIGS. 1 and 2, the color filter 100 includes a substrate 110, a color filter layer 130, and a color conversion layer ("CCL") 140. The substrate 110 has a first pixel area PA1 and a light-blocking area BA surrounding the first pixel area PM. The CCL 140 is disposed above the first pixel area PA1 and converts incident light into a first color light. The color filter layer 130 includes a first portion 131 between the CCL 140 and the substrate 110, and a second portion 132 surrounding side surfaces of the CCL 140. The color filter layer 130 selectively transmits the first color light.

The color filter 100 may further include at least one of a light-blocking layer 120, an upper color filter layer 150, and a planarization layer 160. The light-blocking layer 120 is disposed on the light-blocking area BA of the substrate 110, thereby preventing incident light and the first color light from being emitted through the light-blocking area BA of the substrate 110. The upper color filter layer 150 is disposed above the CCL 140 and the second portion 132 of the color filter layer 130, thereby reflecting the first color light emitted from the CCL 140 and selectively transmitting the incident light to the CCL 140. The planarization layer 160 is disposed on the upper color filter layer 150, thereby providing a flat top surface.

Referring to FIG. 1, a pixel area PA and the light-blocking area BA are defined on a first surface of the substrate 110. The pixel area PA is an area where light is emitted and which is surrounded by the light-blocking area BA. The pixel area PA may be divided into the first pixel area PA1, a second pixel area PA2, and a third pixel area PA3. In an exemplary embodiment, the first pixel area PA1 may be an area where red light is emitted, the second pixel area PA2 may be an area where green light is emitted, and the third pixel area PA3 may be an area where blue light is emitted, for example. However, this is exemplary, and the invention is not limited thereto. The first, second, and third pixel areas PA1, PA2, and PA3 may be matrix-arrayed according to alignment of pixels of the display device.

The light-blocking area BA is an area where light is not emitted, and may be arranged in a mesh form between the first, second, and third pixel areas PA1, PA2, and PA3. When light is emitted through the light-blocking area BA, light leakage may occur in the display device.

The substrate 110 is a transparent substrate through which a first color light (e.g., the red light) emitted from the CCL 140 may pass through the first pixel area PM. A second color light (e.g., green light) may pass through the second pixel area PA2, and a third color light (e.g., the blue light) may pass through the third pixel area PA3.

In an exemplary embodiment, the substrate 110 may include an insulating material including glass, plastic, a crystalline material, etc., for example. However, a material of the substrate 110 is not limited thereto, provided that the material is commonly used. In an exemplary embodiment, the substrate 110 may include a polymer organic material such as polycarbonate ("PC"), polyethylene terephthalate ("PET"), polyethylene ("PE"), polypropylene ("PP"), polysulfone ("PSF"), polymethyl methacrylate ("PMMA"), triacetyl cellulose ("TAC"), cyclo-olefin polymers ("COP"), cyclic olefin copolymer ("COC"), or the like, for example. The material of the substrate 110 may be selected by considering factors such as mechanical strength, thermal stability, transparency, surface smoothness, easy usage, and waterproofness, for example.

The substrate 110 includes the first surface and a second surface that are opposite to each other, and the first, second, and third pixel areas PA1, PA2, and PA3, and the light-blocking area BA therebetween are defined on the first surface. The first color light emitted from the CCL 140 is incident on the first surface of the substrate 110 and externally emitted through the second surface of the substrate 110.

The light-blocking layer 120 may be disposed on the light-blocking area BA. The light-blocking layer 120 may be provided as a thin film on the light-blocking area BA. The light-blocking layer 120 may prevent light from being externally emitted through the light-blocking area BA, and thus preventing light leakage.

The light-blocking layer 120 may have one of various colors including a black color and a white color. When the light-blocking layer 120 has a black color, the light-blocking layer 120 may include a black matrix. When the light-blocking layer 120 has a white color, the light-blocking layer 120 may include an organic insulating material such as a white resin or the like. In an exemplary embodiment, the light-blocking layer 120 may include an opaque inorganic insulating material such as CrOx or MoOx or an opaque organic insulating material such as a black resin or the like.

The color filter layer 130 may be divided into the first portion 131 having a small thickness and the second portion 132 having a large thickness. In an exemplary embodiment, a thickness of the first portion 131 may be disposed between about 0.5 micrometer (μm) and about 2 μm or may be about 1 μm, for example. In an exemplary embodiment, a thickness of the second portion 132 may be disposed between about 3 μm and about 20 μm or between about 5 μm and about 10 μm, for example. The color filter layer 130 may have a grooved shape due to the first and second portions 131 and 132 having different thicknesses in a cross-sectional direction, and the CCL 140 may be arranged in a groove of the color filter layer 130. The first portion 131 may be defined to be positioned between the CCL 140 and the substrate 110, and the second portion 132 may be defined to surround the side surfaces of the CCL 140. The first portion 131 may be defined to be disposed on the first pixel area PA1, and the second portion 132 may be defined to be disposed above the light-blocking area BA. The color filter layer 130 may be disposed in a manner that a photosensitive organic material layer that selectively transmits the first color light is disposed and then the groove is defined by a halftone mask.

The color filter layer 130 may selectively transmit the first color light emitted from the CCL 140, and may reflect incident light to the CCL 140 so that the incident light is not emitted toward the substrate 110. In order to prevent a different color light (e.g., the second color light and the third color light), except for the first color light, from being externally emitted through the first pixel area PA1, the color filter layer 130 may absorb or reflect the different color light.

Since the color filter layer 130 reflects the incident light to the CCL 140, light is recycled so that a color conversion rate and a luminescent efficiency may be increased. Since the color filter layer 130 blocks transmission of the different color light, except for the first color light, only the first color light is emitted through the first pixel area PA1 so that color reproduction may be improved.

The color filter layer 130 may be a band-pass filter to selectively transmit only the first color light. In an exemplary embodiment, when the first color light is red light, the color filter layer 130 may be a red-color light pass filter to block transmission of the green light and the blue light and to transmit only the red light. When the first color light is green light, the color filter layer 130 may be a green-color light pass filter to block transmission of the red light and the blue light and to transmit only the green light, for example.

The CCL 140 is disposed on the first portion 131 of the color filter layer 130, converts the incident light into the first color light, and emits the converted light toward the substrate 110.

According to the exemplary embodiment, the incident light may be blue light, and the first color light may be red light or green light. In another exemplary embodiment, the incident light may be ultraviolet light, and the first color light may be red light, green light, or blue light. In an exemplary embodiment, the red light has a peak wavelength that is equal to or greater than 580 nanometers (nm) and is less than 750 nm, for example. In an exemplary embodiment, the green light has a peak wavelength that is equal to or greater than 495 nm and is less than 580 nm, for example. In an exemplary embodiment, the blue light has a peak wavelength that is equal to or greater than 400 nm and is less than 495 nm, for example. In an exemplary embodiment, the ultraviolet light has a peak wavelength that is equal to or greater than 200 nm and is less than 400 nm, for example. In another exemplary embodiment, a first color may be a color (e.g., a cyan color, a magenta color, or a yellow color) other than the red, green, or blue color. Hereinafter, it is assumed that the CCL 140 converts the blue light into red light, for example.

The CCL 140 may include a semiconductor nanocrystal-polymer composite. The CCL 140 may be patterned. In an exemplary embodiment, the CCL 140 may have a patterned semiconductor nanocrystal-polymer composite by patterning a semiconductor nanocrystal-polymer solution by an inkjet coating method or a screen printing method, for example, but the invention is not limited thereto.

Throughout the specification, a semiconductor nanocrystal may include at least one quantum dot (i.e., an isotropic semiconductor nanocrystal). According to the exemplary embodiment, as illustrated in FIG. 2, the CCL 140 may include a photosensitive polymer 141 in which quantum dots 142 are dispersed. The CCL 140 may further include scattering particles 143 that are dispersed in the photosensitive polymer 141.

The quantum dots 142 may emit the first color light that is excited by incident light and thus has a wavelength longer than that of the incident light. In an exemplary embodiment, the quantum dots 142 may absorb the blue light and may emit the red light having a wavelength band longer than that of the blue light, for example. The photosensitive polymer 141 may include an organic material such as a silicon resin, an epoxy resin, etc., which has a light-transmission ability. The scattering particles 143 allow more quantum dots to be excited by scattering incident light that is not absorbed by the quantum dots 142, and by doing so, the scattering particles 143 may increase a color conversion rate of the CCL 140. In an exemplary embodiment, the scattering particles 143 may be titanium dioxide ($TiO_2$), a metal particle, or the like, for example. However, a material of the scattering particles 143 is not limited thereto, provided that the material is commonly used.

The quantum dots 142 may adjust an emission wavelength by varying a size or combination of the quantum dots 142. In an exemplary embodiment, the quantum dots 142 may include a group II-VI compound, a group III-V compound, a group IV-VI compound, a group IV compound, or a combination thereof, for example.

In an exemplary embodiment, the group II-VI compound may be one of a two-element compound including materials including CdSe, CdTe, ZnS, ZnSe, ZnTe, ZnO, HgS, HgSe, HgTe, MgSe, MgS and a combination thereof, a three-element compound including materials including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a combination thereof, and a four-element compound including materials including HgZnTeS, CdZnSeS, CdZnSeTe, CdZnSTe, CdHgSeS, CdHgSeTe, CdHgSTe, HgZnSeS, HgZnSeTe, HgZnSTe and a combination thereof, for example.

In an exemplary embodiment, the group III-V compound may be one of a two-element compound including materials including GaN, GaP, GaAs, GaSb, AlN, AlP, AlAs, AlSb, InN, InP, InAs, InSb and a combination thereof, a three-element compound including materials including GaNP, GaNAs, GaNSb, GaPAs, GaPSb, AlNP, AlNAs, AlNSb, AlPAs, AlPSb, InNP, InNAs, InNSb, InPAs, InPSb, GaAlNP and a combination thereof, and a four-element compound including materials including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a combination thereof, for example.

In an exemplary embodiment, the group IV-VI compound may be one of a two-element compound including materials including SnS, SnSe, SnTe, PbS, PbSe, PbTe and a combination thereof, a three-element compound including materials including SnSeS, SnSeTe, SnSTe, PbSeS, PbSeTe, PbSTe, SnPbS, SnPbSe, SnPbTe and a combination thereof, and a four-element compound including materials including SnPbSSe, SnPbSeTe, SnPbSTe and a combination thereof, for example.

The group IV compound may be one of a single-element compound including materials including Si, Ge and a combination thereof, and a two-element compound including materials including SiC, SiGe and a combination thereof.

The two-element compound, the three-element compound, or the four-element compound may be provided in a particle while the two-element compound, the three-element compound, or the four-element compound has uniform concentration, or may be in a same particle in which the two-element compound, the three-element compound, or the four-element compound is divided into states in which concentration varies. The quantum dots 142 may each have a core-shell structure in which one semiconductor nanocrystal surrounds another semiconductor nanocrystal. An interface between a core and a shell may have a concentration gradient by which concentration of an element in the shell is gradually decreased toward a center. The quantum dots 142 may each have a structure including one semiconductor nanocrystal core and a multi-layered shell surrounding the semiconductor nanocrystal. In this regard, the multi-layered shell may have at least two layers, each of which has a single combination, an alloy, or a concentration gradient.

The quantum dots 142 may each have a structure in which a combination of a material included in a shell has an energy bandgap greater than that of a core so that a quantum restriction effect is effectively achieved. In the case where the shell is a multi-layered shell, a shell distant from the core may have an energy bandgap greater than that of a shell close to the core.

In an exemplary embodiment, the quantum dots 142 may have a quantum yield of about at least 10 percent (%), e.g., about at least 30%, about at least 50%, about at least 60%, about at least 70%, or about at least 90%, and the invention is not limited thereto.

In order to improve color purity or color reproduction in a display, the quantum dots 142 may each have a spectrum having a relatively small width. In an exemplary embodiment, the quantum dots 142 may each have a full width at a half maximum of about 45 nm, e.g., about 40 nm or about 30 nm at in an emission wavelength spectrum, for example.

The quantum dots 142 may each have a diameter between about 1 nm and about 100 nm (if a shape of each quantum dot 142 is not round, the diameter refers to a size of a longest part of the shape). In an exemplary embodiment, the quantum dots 142 may each have a diameter between about 1 nm and about 20 nm (if a shape of each quantum dot 142 is not round, the diameter refers to a size of a longest part of the shape), for example.

According to another exemplary embodiment, the CCL 140 including the semiconductor nanocrystal-polymer composite may include at least one of a quantum rod and a sheet-type semiconductor (i.e., a quantum plate), instead of the quantum dots 142, or may include both the quantum dots 142 and at least one of the quantum rod and the sheet-type semiconductor.

According to another exemplary embodiment, the CCL 140 may include phosphors for converting incident light into the first color light (e.g., the red light).

The upper color filter layer 150 is disposed on the CCL 140 and the second portion 132 of the color filter layer 130. The upper color filter layer 150 may selectively transmit the incident light, and may reflect the first color light (e.g., the red light) emitted from the CCL 140 so as to allow the first color light to be emitted toward the substrate 110, so that luminescent efficiency may be improved. According to the exemplary embodiment, the upper color filter layer 150 may be provided by alternately stacking at least two layers having different refractive indexes. The upper color filter layer 150 may not be provided.

The planarization layer 160 may be disposed on the upper color filter layer 150. The planarization layer 160 may be transparent to allow the incident light to be irradiated to the CCL 140. The planarization layer 160 may include a transparent organic material including a polyimide resin, an acryl resin, a resist material, or the like. In an exemplary embodiment, the planarization layer 160 may be provided by a wet process including a slit coating method, a spin coating method, or the like, or a dry process including a chemical vapor deposition method, a vacuum deposition method, or the like, for example. The exemplary embodiment is not limited to the aforementioned materials and forming methods.

Figure 3:
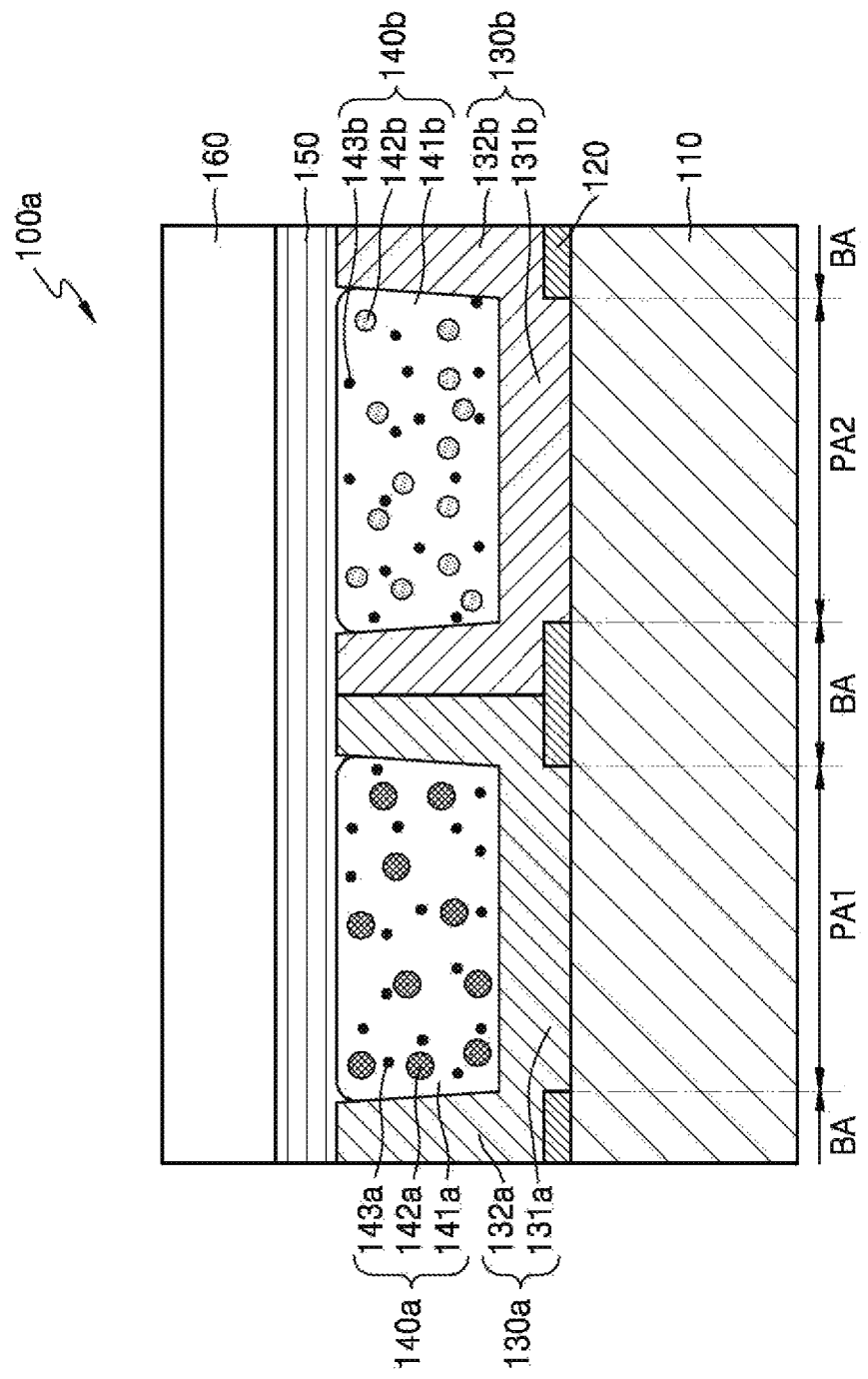
FIG. 3 is a cross-sectional view of another exemplary embodiment of a color filter.

FIG. 3 is a cross-sectional view of a color filter 100a, taken along line of FIG. 1, according to another exemplary embodiment.

Referring to FIGS. 1 and 3, the color filter 100a includes the substrate 110, first and second color filter layers 130a and 130b, and first and second CCLs 140a and 140b. The substrate 110 includes first and second pixel areas PA1 and PA2 that are separate from each other, and a light-blocking area BA that surrounds the first and second pixel areas PA1 and PA2.

The first CCL 140a is disposed above the first pixel area PA1 and converts incident light into a first color light. The first color filter layer 130a selectively transmits the first color light, and includes a first portion 131a between the first CCL 140a and the substrate 110, and a second portion 132a surrounding side surfaces of the first CCL 140a. The second CCL 140b is disposed above the second pixel area PA2 and converts the incident light into a second color light. The second color filter layer 130b selectively transmits the second color light, and includes a first portion 131b between the second CCL 140b and the substrate 110, and a second portion 132b surrounding side surfaces of the second CCL 140b. Hereinafter, it is assumed that the incident light is blue light, the first color light is red light, and the second color light is green light, for example. However, the invention is not limited thereto.

The color filter 100a may further include at least one of the light-blocking layer 120, the upper color filter layer 150, and the planarization layer 160. The light-blocking layer 120 is disposed on the light-blocking area BA, thereby preventing light from being emitted through the light-blocking area BA of the substrate 110. The upper color filter layer 150 is disposed on the first and second CCLs 140a and 140b and the second portions 132a and 132b of the first and second color filter layers 130a and 130b, thereby reflecting the first color light and the second color light (e.g., the red light and green light) and selectively transmitting the incident light (e.g., the blue light) to the first and second CCLs 140a and 140b. The planarization layer 160 is disposed on the upper color filter layer 150, thereby providing a flat top surface.

The substrate 110 is a transparent substrate through which the red light and green light respectively emitted from the first and second CCLs 140a and 140b pass through the first and second pixel areas PA1 and PA2. The substrate 110 includes a first surface on which the red light and green light respectively emitted from the first and second CCLs 140a and 140b are incident, and a second surface through which the red light and green light are emitted.

The light-blocking layer 120 may be disposed on the light-blocking area BA, thereby preventing light from being externally emitted through the light-blocking area BA and thus preventing light leakage. According to the exemplary embodiment, the light-blocking layer 120 may include a black matrix.

The first color filter layer 130a may be divided into the first portion 131a having a small thickness and the second portion 132a having a large thickness. The first color filter layer 130a may have a grooved shape due to the first and second portions 131a and 132a having different thicknesses and the first CCL 140a may be arranged in a groove of the first color filter layer 130a. The first portion 131a between the first CCL 140a and the substrate 110 may correspond to the first pixel area PA1. The second portion 132a may be disposed above the light-blocking area BA and may surround the side surfaces of the first CCL 140a.

The first color filter layer 130a may selectively transmit the red light emitted from the first CCL 140a, and may reflect blue incident light to the first CCL 140a so as to prevent the blue incident light from being emitted through the substrate 110. The first color filter layer 130a may absorb or reflect the green light and the blue light so as to prevent light of different colors (e.g., green light and the blue light) other than the red light from being externally emitted through the first pixel area PA1.

Since the first color filter layer 130a reflects the blue incident light to the first CCL 140a, light is recycled so that a color conversion rate and a luminescent efficiency of the first CCL 140a may be increased. Since the first color filter layer 130a blocks transmission of green light and the blue light, only the red light is emitted through the first pixel area PA1 so that color purity and color reproduction may be improved.

The first color filter layer 130a may be a band-pass filter to selectively transmit only the red light. The first color filter layer 130a may be a red-light pass filter to block transmission of green light and the blue light and to transmit only the red light.

The second color filter layer 130b may include the first portion 131b having a small thickness and the second portion 132b having a large thickness, and may have a grooved shape due to the first and second portions 131b and 132b having different thicknesses. The second CCL 140b may be arranged in a groove of the second color filter layer 130b. The first portion 131b between the second CCL 140b and the substrate 110 may correspond to the second pixel area PA2. The second portion 132b may be disposed above the light-blocking area BA and may surround the side surfaces of the second CCL 140b.

The second color filter layer 130b may selectively transmit green light emitted from the second CCL 140b, and may reflect the blue incident light to the second CCL 140b so as to prevent the blue incident light from being emitted through the substrate 110. The second color filter layer 130b may absorb or reflect the red light and the blue light so as to prevent light of different colors (e.g., the red light and the blue light) other than green light from being externally emitted through the second pixel area PA2.

Since the second color filter layer 130b reflects the blue incident light to the second CCL 140b, light is recycled so that a color conversion rate and a luminescent efficiency of the second CCL 140b may be increased. Since the second color filter layer 130b blocks transmission of the red light and the blue light, only green light is emitted through the second pixel area PA2 so that color purity and color reproduction may be improved.

The second color filter layer 130b may be a band-pass filter to selectively transmit only green light. The second color filter layer 130b may be a green-light pass filter to block transmission of the red light and the blue light and to transmit only green light.

The first CCL 140a is disposed on the first portion 131a of the first color filter layer 130a, converts blue light into red light, and emits the converted light toward the substrate 110. The first CCL 140a may include a semiconductor nanocrystal-polymer composite. A semiconductor nanocrystal may include a quantum dot (i.e., an isotropic semiconductor nanocrystal). According to the illustrated exemplary embodiment, as illustrated in FIG. 3, the first CCL 140a may include a first photosensitive polymer 141a in which first quantum dots 142a are dispersed. The first CCL 140a may further include first scattering particles 143a that are dispersed in the first photosensitive polymer 141a.

The first quantum dots 142a may isotropically emit red light that is excited by blue light and thus has a wavelength longer than that of the blue light. The first quantum dots 142a may absorb the blue light and may emit the red light. The first photosensitive polymer 141a may include an organic material having a light-transmission ability. The first scattering particles 143a allow more first quantum dots 142a to be excited by scattering blue light that is not absorbed by the first quantum dots 142a, and by doing so, the first scattering particles 143a may increase a color conversion rate of the first CCL 140a. In an exemplary embodiment, the first scattering particles 143a may be $TiO_2$, a metal particle, or the like, for example.

In an exemplary embodiment, the first quantum dots 142a may include a group II-VI compound, a group III-V compound, a group IV-VI compound, a group IV compound, or a combination thereof, for example. In another exemplary embodiment, the first CCL 140a may include phosphors for converting blue incident light into red light, for example.

The second CCL 140b is disposed on the first portion 131b of the second color filter layer 130b, converts the blue light into green light, and emits the converted light toward the substrate 110. The second CCL 140b may include a semiconductor nanocrystal-polymer composite. A semiconductor nanocrystal may include a quantum dot (i.e., an isotropic semiconductor nanocrystal). According to the illustrated exemplary embodiment, as illustrated in FIG. 3, the second CCL 140*b* may include a second photosensitive polymer 141*b* in which second quantum dots 142*b* are dispersed. The second CCL 140*b* may further include second scattering particles 143*b* that are dispersed in the second photosensitive polymer 141*b*.

The second quantum dots 142*b* may isotropically emit green light that is excited by the blue light and thus has a wavelength longer than that of the blue light. The second quantum dots 142*b* may absorb the blue light and may emit green light. The second photosensitive polymer 141*b* may include an organic material having a light-transmission ability which is the same as that included in the first photosensitive polymer 141*a*. The second scattering particles 143*b* allow more second quantum dots 142*b* to be excited by scattering blue light that is not absorbed by the second quantum dots 142*b*, and by doing so, the second scattering particles 143*b* may increase a color conversion rate of the second CCL 140*b*. In an exemplary embodiment, the second scattering particles 143*b* may be $TiO_2$, a metal particle, or the like which is the same as the first scattering particles 143*a*, for example.

In an exemplary embodiment, the second quantum dots 142*b* may include a group II-VI compound, a group III-V compound, a group IV-VI compound, a group IV compound, or a combination thereof, for example. In another exemplary embodiment, the second CCL 140*b* may include phosphors for converting blue incident light into green light, for example.

The first and second quantum dots 142*a* and 142*b* may include the same material. However, a size of the second quantum dots 142*b* may be different from a size of the first quantum dots 142*a*. As a wavelength of emitted light is increased, a size of quantum dots tends to increase to induce sufficient surface plasmon resonance. Therefore, a wavelength of green light is shorter than a wavelength of red light so that the size of the second quantum dots 142*b* may be smaller than the size of the first quantum dots 142*a*.

As illustrated in FIG. 3, the second portions 132*a* and 132*b* of the first and second color filter layers 130*a* and 130*b* are disposed between and overlap the first and second CCLs 140*a* and 140*b* along a horizontal direction. Accordingly, red light that is laterally emitted from the first CCL 140*a* cannot pass through the second color filter layer 130*b* and thus cannot be emitted to the second pixel area PA2, and green light that is laterally emitted from the second CCL 140*b* cannot pass through the first color filter layer 130*a* and thus cannot be emitted to the first pixel area PM. Therefore, there is no need to arrange an additional light-blocking partition between the first and second CCLs 140*a* and 140*b*.

The upper color filter layer 150 is disposed on the first and second CCLs 140*a* and 140*b* and the first and second color filter layers 130*a* and 130*b*. The upper color filter layer 150 may selectively transmit green light, and may reflect the red light and green light respectively emitted from the first and second CCLs 140*a* and 140*b* so as to allow the red light and green light to be emitted toward the substrate 110, so that luminescent efficiency may be improved. However, the invention is not limited thereto, and in another exemplary embodiment, the upper color filter layer 150 may not be provided.

Figure 4:
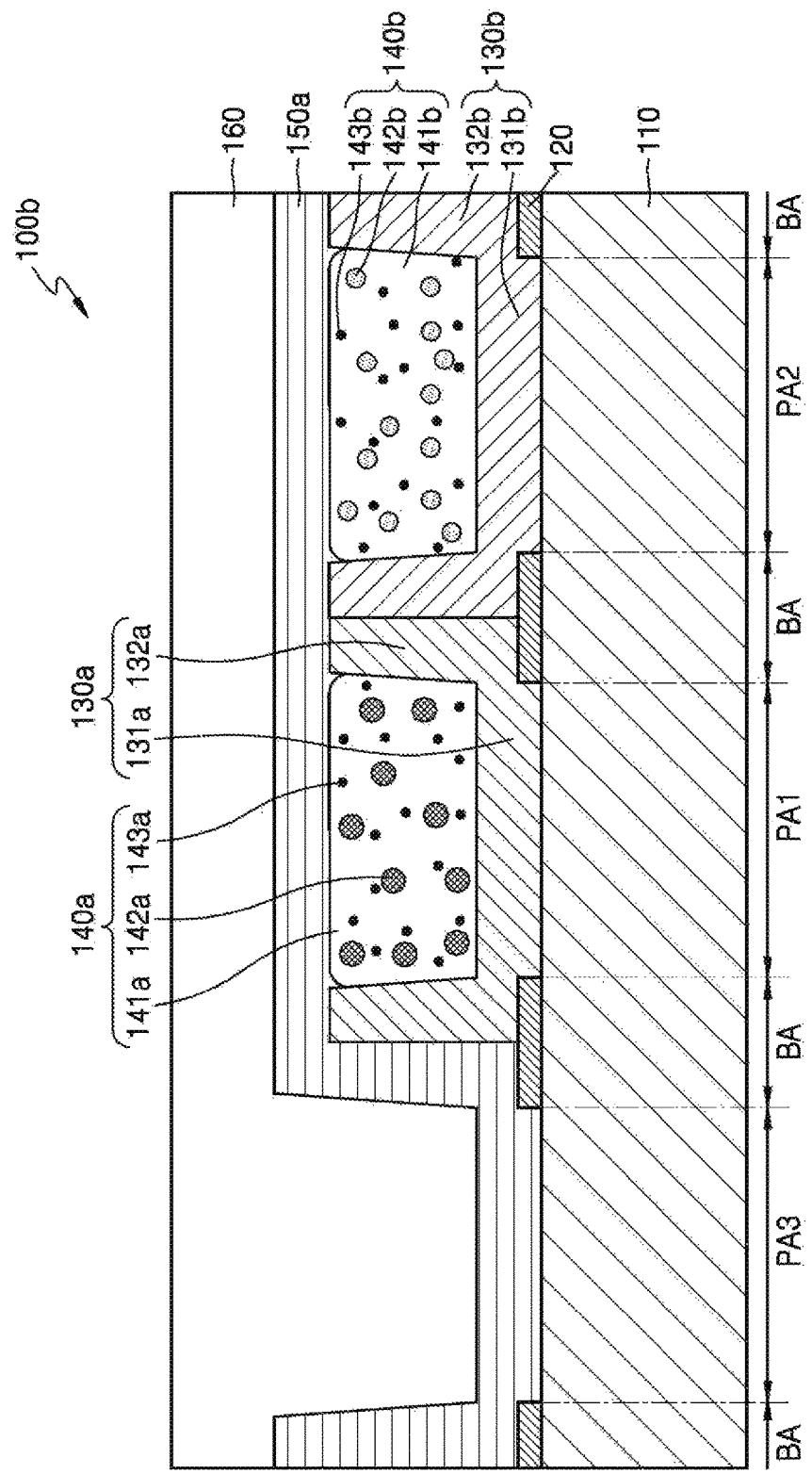
FIG. 4 is a cross-sectional view of another exemplary embodiment of a color filter.

FIG. 4 is a cross-sectional view of a color filter 100*b*, taken along line IV-IV of FIG. 1, according to another exemplary embodiment.

Referring to FIGS. 1 and 4, the color filter 100*b* includes the substrate 110, the first and second color filter layers 130*a* and 130*b*, the first and second CCLs 140*a* and 140*b*, and an upper color filter layer 150*a*. The substrate 110 includes a pixel area PA including first, second, and third pixel areas PA1, PA2, and PA3 that are separate from one another, and a light-blocking area BA that surrounds the first, second, and third pixel areas PA1, PA2, and PA3.

The first CCL 140*a* is disposed above the first pixel area PA1 and converts incident light into a first color light. The first color filter layer 130*a* selectively transmits the first color light, and includes a first portion 131*a* between the first CCL 140*a* and the substrate 110, and a second portion 132*a* surrounding side surfaces of the first CCL 140*a*. The second CCL 140*b* is disposed above the second pixel area PA2 and converts the incident light into a second color light. The second color filter layer 130*b* selectively transmits the second color light, and includes a first portion 131*b* between the second CCL 140*b* and the substrate 110, and a second portion 132*b* surrounding side surfaces of the second CCL 140*b*. Since the first and second CCLs 140*a* and 140*b*, and the first and second color filter layers 130*a* and 130*b* are described above with reference to FIG. 3, detailed descriptions thereof may be omitted.

The upper color filter layer 150*a* is disposed on the third pixel area PA3, the first and second CCLs 140*a* and 140*b*, and the first and second color filter layers 130*a* and 130*b*. The upper color filter layer 150*a* may cover a sidewall of the first color filter layer 130*a* that is close to the third pixel area PA3 and is extended from sidewalls of the second portions 132*a* and 132*b* of the first and second color filter layers 130*a* and 130*b*. The upper color filter layer 150*a* may reflect the first color light and the second color light and may selectively transmit incident light to the first and second CCLs 140*a* and 140*b*. The third pixel area PA3 may externally emit the incident light having passed through the upper color filter layer 150*a*.

The color filter 100*b* may further include at least one of the light-blocking layer 120 and the planarization layer 160. The light-blocking layer 120 may be disposed on the light-blocking area BA, thereby preventing light from being externally emitted through the light-blocking area BA of the substrate 110 and thus preventing light leakage. The planarization layer 160 is disposed on the upper color filter layer 150*a*, thereby providing a flat top surface.

Hereinafter, it is assumed that the incident light is blue light, the first color light is red light, and the second color light is green light, for example. However, the invention is not limited thereto.

The substrate 110 is a transparent substrate capable of transmitting light. The red light emitted from the first CCL 140*a* is externally emitted through the first pixel area PA1, green light emitted from the second CCL 140*b* is externally emitted through the second pixel area PA2, and the blue light that is the incident light is externally emitted through the third pixel area PA3. As illustrated in FIG. 1, the second pixel area PA2 and the third pixel area PA3 may be arrayed adjacent to each other.

The upper color filter layer 150*a* is disposed on the third pixel area PA3 and the sidewall that is close to the third pixel area PA3 and is extended from the sidewalls of the second portions 132*a* and 132*b*, thereby selectively transmitting the blue incident light and reflecting the red light and green light. The incident light may include the red light or green light, in addition to the blue light. By preventing the red light or green light included in the incident light from being externally emitted through the third pixel area PA3, color purity and color reproduction may be improved.

As illustrated in FIG. 4, since the upper color filter layer 150a surrounds the first and second CCLs 140a and 140b, it is possible to prevent red light and green light that are laterally emitted from the first and second CCLs 140a and 140b, respectively, from being emitted to the third pixel area PA3. Therefore, there is no need to arrange an additional light-blocking partition between the first and second pixel areas PA1 and PA2, and the third pixel area PA3.

The planarization layer 160 may be disposed on the upper color filter layer 150a. In an exemplary embodiment, the planarization layer 160 may include a transparent organic material in which scattering particles such as $TiO_2$, a metal particle, or the like are dispersed, for example.

Figure 5:
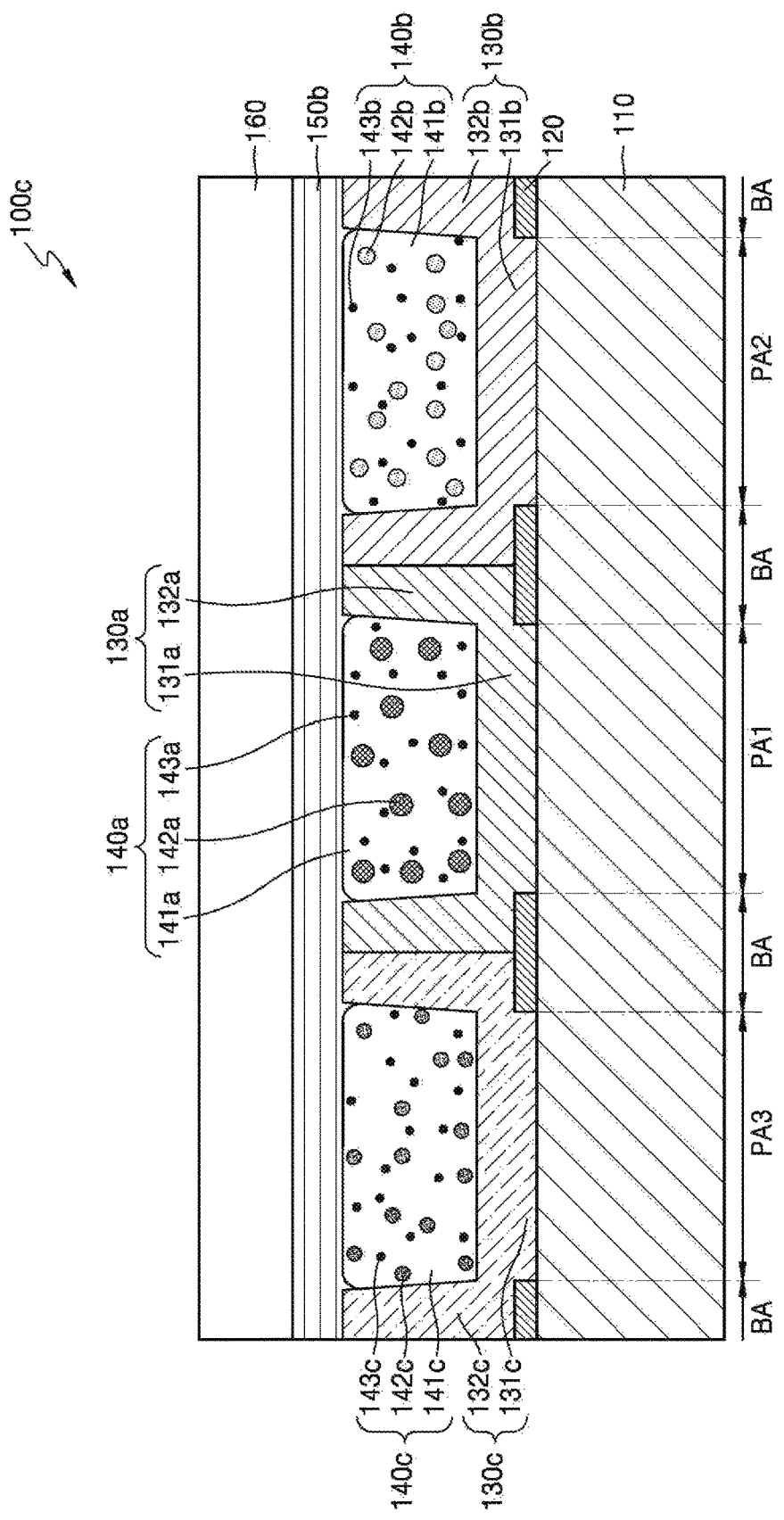
FIG. 5 is a cross-sectional view of another exemplary embodiment of a color filter.

FIG. 5 is a cross-sectional view of a color filter 100c, taken along line IV-IV of FIG. 1, according to another exemplary embodiment.

Referring to FIGS. 1 and 5, the color filter 100c includes the substrate 110, first, second, and third color filter layers 130a, 130b, and 130c, and first, second, and third CCLs 140a, 140b, and 140c. The substrate 110 includes a pixel area PA including first, second, and third pixel areas PA1, PA2, and PA3 that are separate from one another, and a light-blocking area BA that surrounds the first, second, and third pixel areas PA1, PA2, and PA3.

The first CCL 140a is disposed above the first pixel area PA1 and converts incident light into a first color light. The first color filter layer 130a selectively transmits the first color light, and includes a first portion 131a between the first CCL 140a and the substrate 110, and a second portion 132a surrounding side surfaces of the first CCL 140a.

The second CCL 140b is disposed above the second pixel area PA2 and converts the incident light into a second color light. The second color filter layer 130b selectively transmits the second color light, and includes a first portion 131b between the second CCL 140b and the substrate 110, and a second portion 132b surrounding side surfaces of the second CCL 140b.

The third CCL 140c is disposed above the third pixel area PA3 and converts the incident light into a third color light. The third color filter layer 130c selectively transmits the third color light, and includes a first portion 131c between the third CCL 140c and the substrate 110, and a second portion 132c surrounding side surfaces of the third CCL 140c.

Since the first and second CCLs 140a and 140b, and the first and second color filter layers 130a and 130b are described above with reference to FIG. 3, detailed descriptions thereof may be omitted.

The color filter 100c may further include at least one of the light-blocking layer 120, an upper color filter layer 150b, and the planarization layer 160. The light-blocking layer 120 may be disposed on the light-blocking area BA, thereby preventing light from being externally emitted through the light-blocking area BA of the substrate 110 and thus preventing light leakage. The upper color filter layer 150b is disposed above the first, second, and third color filter layers 130a, 130b, and 130c, and the first, second, and third CCLs 140a, 140b, and 140c, thereby reflecting the first color light, the second color light, and the third color light, and selectively transmitting the incident light to the first, second, and third CCLs 140a, 140b, and 140c. The planarization layer 160 is disposed on the upper color filter layer 150b, thereby providing a flat top surface.

Hereinafter, it is assumed that the incident light is ultraviolet light, and first, second, and third colors are respectively a red color, green color, and blue color, for example. However, the invention is not limited thereto.

The substrate 110 is a transparent substrate capable of transmitting light. The red light emitted from the first CCL 140a is externally emitted through the first pixel area PA1, green light emitted from the second CCL 140b is externally emitted through the second pixel area PA2, and the blue light emitted from the third CCL 140c is externally emitted through the third pixel area PA3.

The third color filter layer 130c may include the first portion 131c having a small thickness and the second portion 132c having a large thickness, and may have a grooved shape due to the first and second portions 131c and 132c having different thicknesses. The third CCL 140c may be arranged in a groove of the third color filter layer 130c. The first portion 131c between the third CCL 140c and the substrate 110 may correspond to the third pixel area PA3. The second portion 132c may be disposed on the light-blocking area BA and may surround the side surfaces of the third CCL 140c.

The third color filter layer 130c may selectively transmit the blue light emitted from the third CCL 140c, and may reflect incident ultraviolet light to the third CCL 140c so as to prevent the incident ultraviolet light from being emitted through the substrate 110. The third color filter layer 130c may absorb or reflect the red light and green light so as to prevent light of different colors (e.g., the red light and green light) other than the blue light from being externally emitted through the third pixel area PA3.

Since the third color filter layer 130c reflects the ultraviolet light to the third CCL 140c, light is recycled so that a color conversion rate and a luminescent efficiency of the third CCL 140c may be increased. Since the third color filter layer 130c blocks transmission of the red light and green light, only the blue light is emitted through the third pixel area PA3 so that color purity and color reproduction may be improved.

The third color filter layer 130c may be a band-pass filter to selectively transmit only the blue light. The third color filter layer 130c may be a blue-light pass filter to block transmission of the ultraviolet light, the red light, and green light and to transmit only the blue light.

The third CCL 140c is disposed on the first portion 131c of the third color filter layer 130c, converts the incident ultraviolet light into blue light, and emits the converted light toward the substrate 110. The third CCL 140c may include a third photosensitive polymer 141c in which third quantum dots 142c are dispersed. The third CCL 140c may further include third scattering particles 143c that are dispersed in the third photosensitive polymer 141c.

The third quantum dots 142c may isotropically emit blue light that is excited by ultraviolet light and thus has a wavelength longer than that of the ultraviolet light. The third quantum dots 142c may absorb the ultraviolet light and may emit the blue light. The third photosensitive polymer 141c may include an organic material having a light-transmission ability which is the same as that included in the first and second photosensitive polymers 141a and 141b. The third scattering particles 143c allow more third quantum dots 142c to be excited by scattering ultraviolet light that is not absorbed by the third quantum dots 142c, and by doing so, the third scattering particles 143c may increase a color conversion rate of the third CCL 140c. The third scattering particles 143c may be $TiO_2$, a metal particle, or the like which is the same as the first and second scattering particles 143a and 143b.

In an exemplary embodiment, the third scattering particles 143c may include a group II-VI compound, a group III-V compound, a group IV-VI compound, a group IV compound, or a combination thereof, for example. In another exemplary embodiment, the third CCL 140c may include phosphors for converting ultraviolet light into blue light, for example.

The first, second, and third quantum dots 142a, 142b, and 142c may include the same material but may have different sizes. As a wavelength of emitted light is increased, a size of quantum dots tends to increase to induce sufficient surface plasmon resonance. Therefore, a size of the third quantum dots 142c may be smaller than a size of the second quantum dots 142b, and the size of the second quantum dots 142b may be smaller than a size of the first quantum dots 142a.

As illustrated in FIG. 5, two of the first, second, and third color filter layers 130a, 130b, and 130c are disposed between and overlap the first, second, and third CCLs 140a, 140b, and 140c along a horizontal direction. Accordingly, red light that is laterally emitted from the first CCL 140a cannot be emitted to the second and third pixel areas PA2 and PA3, green light that is laterally emitted from the second CCL 140b cannot be emitted to the first and third pixel area PA1 and PA3, and blue light that is laterally emitted from the third CCL 140c cannot be emitted to the first and second pixel area PA1 and PA2. Therefore, there is no need to arrange additional light-blocking partitions among the first, second, and third CCLs 140a, 140b, and 140c.

FIGS. 6A through 6G are cross-sectional views of a color filter that is manufactured according to a processing order to describe a method of manufacturing the color filter 100b of FIG. 4, according to an exemplary embodiment.

Figure 6A:
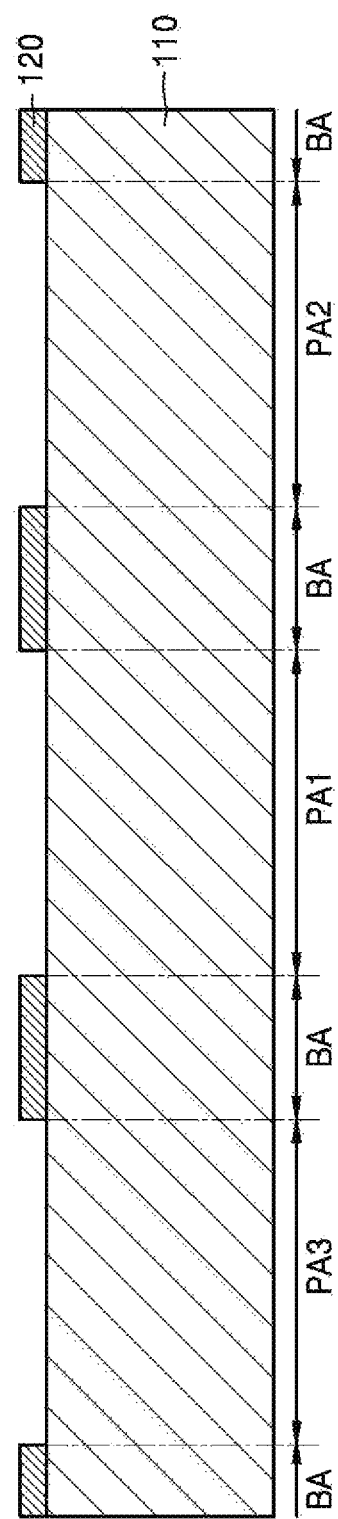
FIGS. 6A through 6G are cross-sectional views of a color filter that is manufactured according to a processing order to describe an exemplary embodiment of a method of manufacturing the color filter of FIG. 4.

Referring to FIG. 6A, the substrate 110 on which the first, second, and third pixel areas PA1, PA2, and PA3, and the light-blocking area BA between each of the first, second, and third pixel areas PA1, PA2, and PA3 are defined is provided. The light-blocking layer 120 is disposed on the light-blocking area BA of the substrate 110. The light-blocking layer 120 may be provided in a manner that a light-blocking material capable of blocking transmission of light is layered and then is patterned to cover the light-blocking area BA through a photolithography process and an etching process.

In an exemplary embodiment, the light-blocking material may be an opaque material such as a metal material, a metal-oxide material, etc., or may be an opaque organic insulating material, for example. In an exemplary embodiment, the light-blocking material may have one of various colors including a black color, a white color, etc., for example.

Figure 6B:
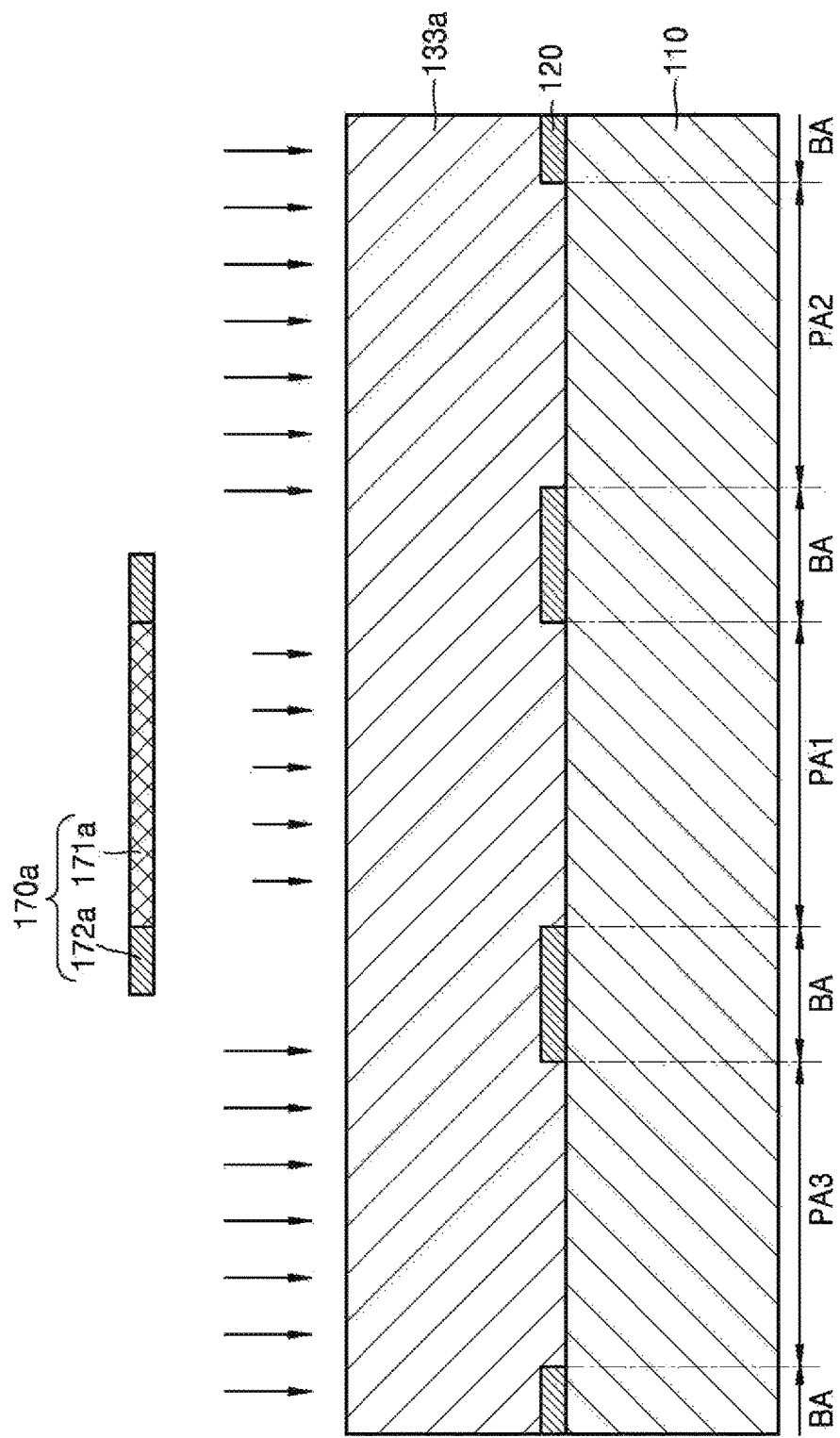

Referring to FIG. 6B, a first sacrifice layer 133a is disposed on the substrate 110. The first sacrifice layer 133a is arranged to provide the first color filter layer 130a shown in FIG. 4, and may include a photosensitive organic material capable of selectively transmitting a first color light (e.g., red light), and blocking, reflecting or absorbing light of different colors (e.g., green light, blue light, ultraviolet light, etc.). In an exemplary embodiment, the first sacrifice layer 133a may be provided by layering the photosensitive organic material having a color filter ability on the substrate 110 by a slit coating method, a spin coating method, etc., for example.

A first halftone mask 170a may be arranged above the substrate 110 on which the first sacrifice layer 133a is disposed. The first halftone mask 170a may include a first portion 171a corresponding to the first portion 131a of the first color filter layer 130a shown in FIG. 4, and a second portion 172a corresponding to the second portion 132a shown in FIG. 4. The first portion 171a may correspond to the first pixel area PM. According to a photosensitive characteristic of the photosensitive organic material in the first sacrifice layer 133a, a masking area of the first halftone mask 170a may vary. The first halftone mask 170a of FIG. 6B is exemplarily provided, assuming that the first sacrifice layer 133a has a positive photosensitive characteristic. The first portion 171a of the first halftone mask 170a may partially block an exposure light, and the second portion 172a may completely block the exposure light. Accordingly, a portion of the first sacrifice layer 133a which is not covered by the first halftone mask 170a may be completely dissolved due to the exposure light, and another portion of the first sacrifice layer 133a which is disposed on the first pixel area PA1 may be partially dissolved.

Figure 6C:
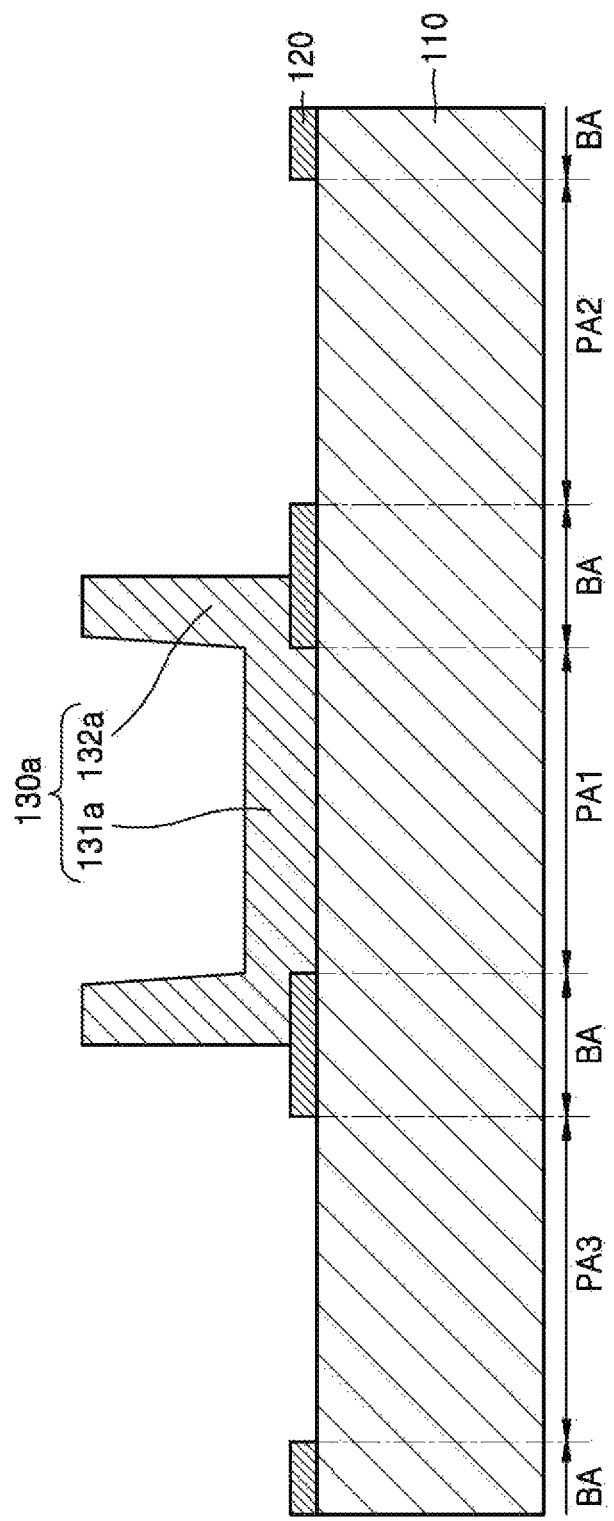

Referring to FIG. 6C, the portion of the first sacrifice layer 133a which is not completely covered by the first halftone mask 170a may be completely removed, the other portion of the first sacrifice layer 133a which is not exposed due to the second portion 172a of the first halftone mask 170a may not be removed, and another portion of the first sacrifice layer 133a which is partially exposed due to the first portion 171a may be partially removed. Accordingly, as illustrated in FIG. 6C, the first color filter layer 130a including the first portion 131a on the first pixel area PA1, and the second portion 132a surrounding the first pixel area PA1 and having a thickness greater than that of the first portion 131a may be disposed. Since the first portion 131a and the second portion 132a have different thicknesses, and the second portion 132a surrounds the first portion 131a, the first color filter layer 130a may have a grooved portion.

Figure 6D:
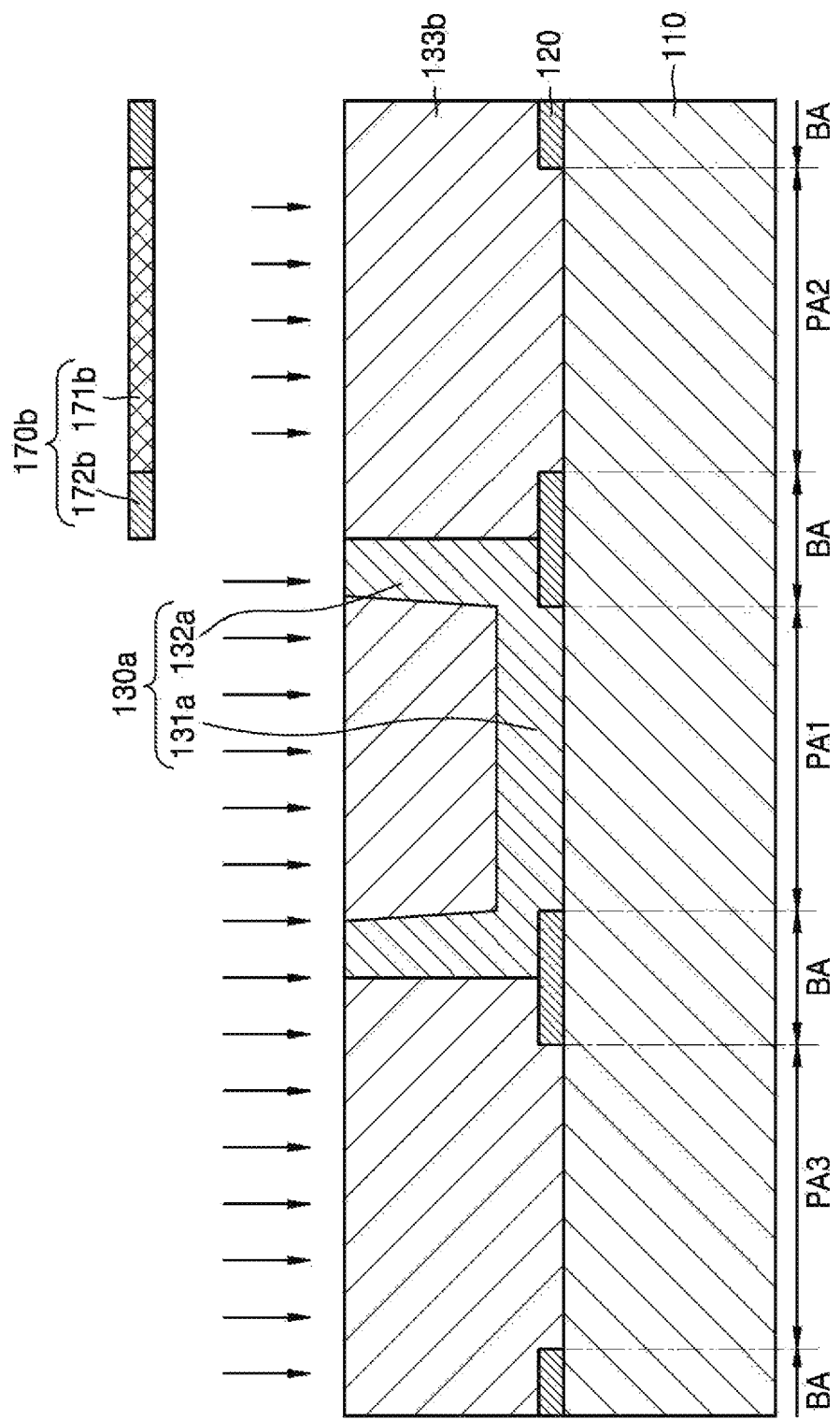

Referring to FIG. 6D, a second sacrifice layer 133b is disposed on the substrate 110 on which the first color filter layer 130a is disposed. The second sacrifice layer 133b is arranged to provide the second color filter layer 130b shown in FIG. 4, and may include a photosensitive organic material capable of selectively transmitting a second color light (e.g., green light), and blocking, reflecting or absorbing light of different colors (e.g., red light, blue light, ultraviolet light, etc.). The second sacrifice layer 133b may be provided by layering the photosensitive organic material having the color filter ability on the substrate 110 by the slit coating method, the spin coating method, etc.

A second halftone mask 170b may be arranged above the substrate 110 on which the second sacrifice layer 133b is disposed. The second halftone mask 170b may include a first portion 171b corresponding to the first portion 131b of the second color filter layer 130b shown in FIG. 4, and a second portion 172b corresponding to the second portion 132b shown in FIG. 4. The first portion 171b may correspond to the second pixel area PA2. The second halftone mask 170b of FIG. 6D is exemplarily provided, assuming that the second sacrifice layer 133b has a positive photosensitive characteristic. The first portion 171b of the second halftone mask 170b may completely block an exposure light, and the second portion 172b may partially block the exposure light. Accordingly, a portion of the second sacrifice layer 133b which is not covered by the second halftone mask 170b may be completely dissolved due to the exposure light, and another portion of the second sacrifice layer 133b which is disposed on the second pixel area PA2 may be partially dissolved.

Figure 6E:
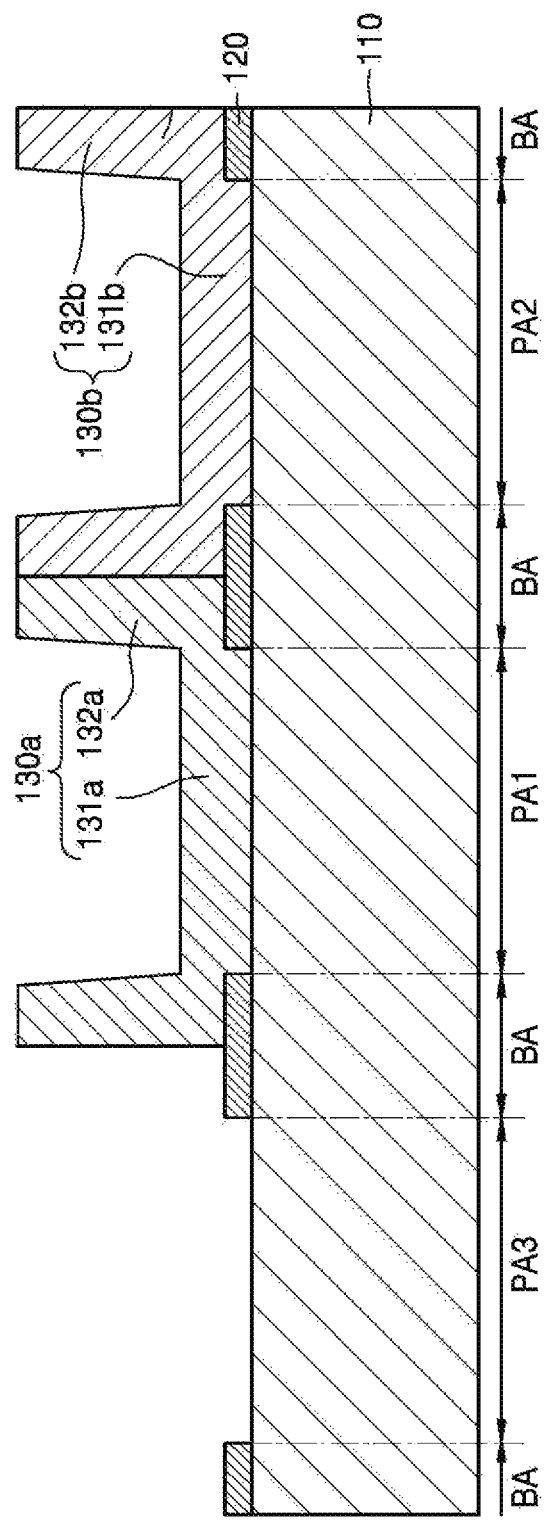

Referring to FIG. 6E, the portion of the second sacrifice layer 133b which is not completely covered by the second halftone mask 170b may be completely removed, the other portion of the second sacrifice layer 133b which is not exposed due to the second portion 172b of the second halftone mask 170b may not be removed, and another portion of the second sacrifice layer 133b which is partially exposed due to the first portion 171b may be partially removed. Accordingly, as illustrated in FIG. 6E, the second color filter layer 130b including the first portion 131b on the second pixel area PA2, and the second portion 132b surrounding the second pixel area PA2 and having a thickness greater than that of the first portion 131b may be disposed. Sidewalls of the second color filter layer 130b and the first color filter layer 130a may directly contact each other. Since the first portion 131b and the second portion 132b have different thicknesses, and the second portion 132b surrounds the first portion 131b, the second color filter layer 130b may have a grooved portion.

Figure 6F:
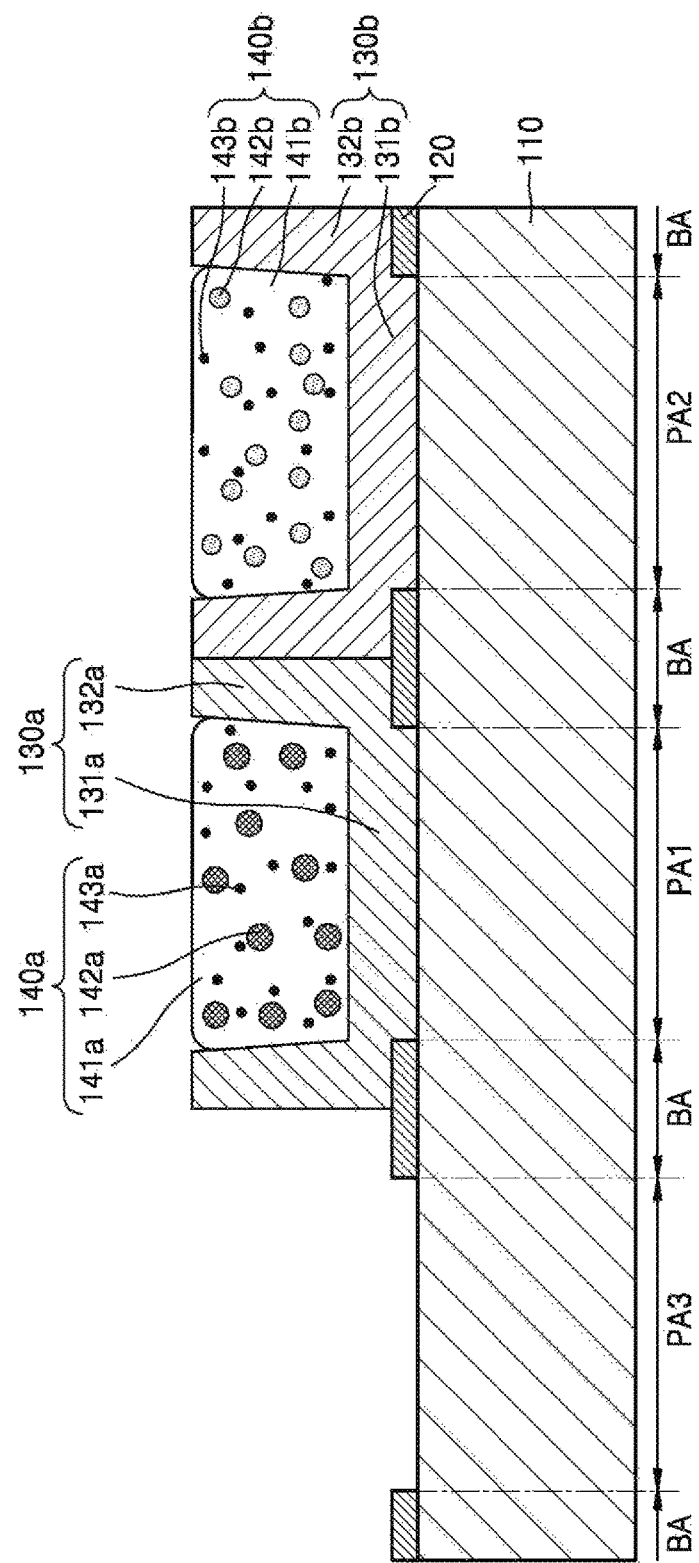

Referring to FIG. 6F, the first CCL 140a may be disposed in the groove of the first color filter layer 130a, and the second CCL 140b may be disposed in the groove of the second color filter layer 130b.

The first CCL 140a may be provided in a manner that a first semiconductor nanocrystal-polymer solution is dropped in the groove of the first color filter layer 130a by an inkjet coating method and then is cured. The first semiconductor nanocrystal-polymer solution may be a solution of the first photosensitive polymer 141a in which the first quantum dots 142a are dispersed. The first scattering particles 143a may be additionally mixed in the solution of the first photosensitive polymer 141a.

The first quantum dots 142a may emit a first color light (e.g., red light) that is excited by incident light (e.g., blue light) and thus has a wavelength longer than that of the incident light. In an exemplary embodiment, the first quantum dots 142a may absorb the blue light and may emit the red light having a wavelength band longer than that of the blue light, for example. In an exemplary embodiment, the first quantum dots 142a may include a group II-VI compound, a group III-V compound, a group IV-VI compound, a group IV compound, or a combination thereof, for example.

The second CCL 140b may be provided in a manner that a second semiconductor nanocrystal-polymer solution is dropped in the groove of the second color filter layer 130b by the inkjet coating method and then is cured. The second semiconductor nanocrystal-polymer solution may be a solution of the second photosensitive polymer 141b in which the second quantum dots 142b are dispersed. The second scattering particles 143b may be additionally mixed in the solution of the second photosensitive polymer 141b.

The second quantum dots 142b may emit a second color light (e.g., green light) that is excited by the incident light (e.g., the blue light) and thus has a wavelength longer than that of the incident light. In an exemplary embodiment, the second quantum dots 142b may absorb the blue light and may emit green light having a wavelength band longer than that of the blue light, for example. In an exemplary embodiment, the second quantum dots 142b may include a group II-VI compound, a group III-V compound, a group IV-VI compound, a group IV compound, or a combination thereof, for example. The second quantum dots 142b may include the same material as that of the first quantum dots 142a but a size of the second quantum dots 142b may be smaller than a size of the first quantum dots 142a.

Figure 6G:
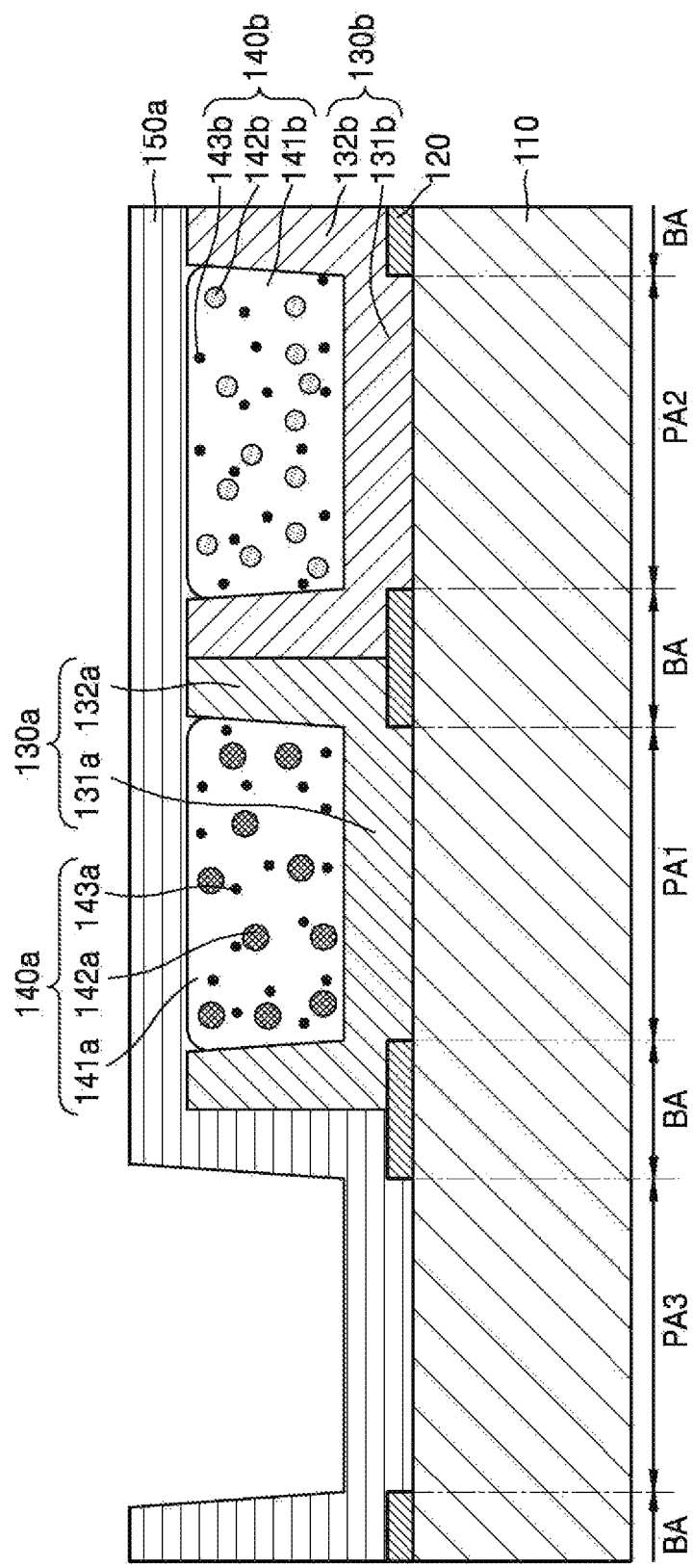

Referring to FIG. 6G, a first upper color filter layer 150a that is the same as the upper color filter layer 150a covering the first and second color filter layers 130a and 130b, and the first and second CCLs 140a and 140b may be disposed above the substrate 110. The first upper color filter layer 150a may include a material capable of selectively transmitting the incident light (e.g., the blue light) and reflecting the first color light and the second color light (e.g., the red light and green light). In an exemplary embodiment, the first upper color filter layer 150a may be provided by a wet process including a slit coating method, a spin coating method, or the like, or a dry process including a chemical vapor deposition method, a vacuum deposition method, or the like, for example. The first upper color filter layer 150a may be provided by alternately stacking at least two layers having different refractive indexes. The first upper color filter layer 150a may be disposed on the third pixel area PA3, so that only the incident light (e.g., the blue light) may be selectively emitted through the third pixel area PA3.

Referring to FIG. 4, the planarization layer 160 may be disposed on the first upper color filter layer 150a. In an exemplary embodiment, the planarization layer 160 may include a transparent organic material including a polyimide resin, an acryl resin, a resist material, or the like, for example. In an exemplary embodiment, the planarization layer 160 may be provided by a wet process including a slit coating method, a spin coating method, or the like, or a dry process including a chemical vapor deposition method, a vacuum deposition method, or the like, for example.

In another exemplary embodiment, after the first CCL 140a is disposed on the first color filter layer 130a shown in FIG. 6C, the second color filter layer 130b may be disposed.

Figure 7:
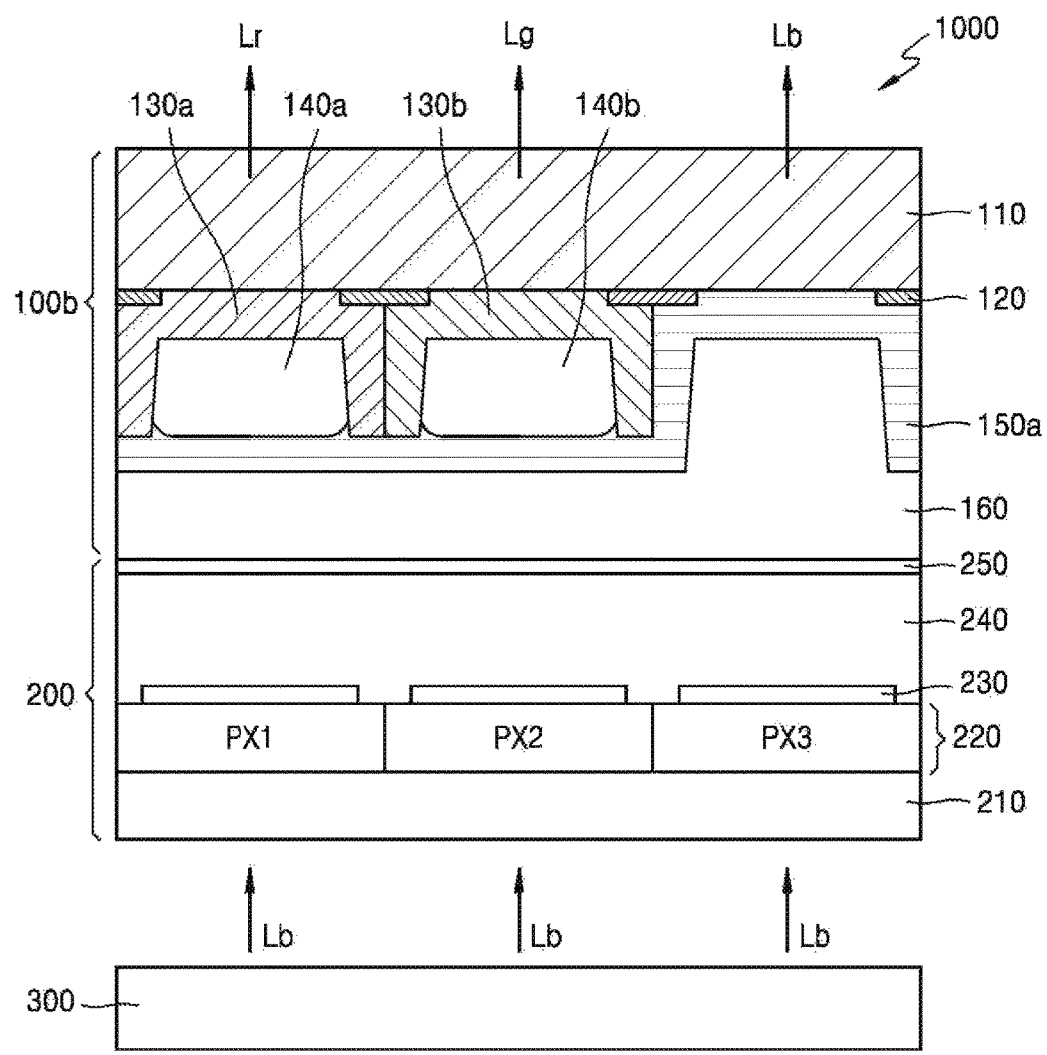
FIG. 7 is a cross-sectional view of an exemplary embodiment of a display device.

FIG. 7 is a cross-sectional view of a display device 1000, according to an exemplary embodiment.

Referring to FIG. 7, the display device 1000 includes a backlight unit 300, a liquid-crystal display ("LCD") panel 200, and a color filter 100b. The color filter 100b of the exemplary embodiment corresponds to the color filter 100b shown in FIG. 4 but may be replaced with the color filter 100c in the previous exemplary embodiment.

The backlight unit 300 may provide light for providing an image on the LCD panel 200. In an exemplary embodiment, the backlight unit 300 may include a light source to emit blue light Lb, for example. In another exemplary embodiment, the backlight unit 300 may include a light source to emit ultraviolet light, and in this case, the color filter 100c of FIG. 5 may be used instead of the color filter 100b.

The LCD panel 200 includes a bottom substrate 210, a pixel circuit 220 on the bottom substrate 210, pixel electrodes 230, a liquid crystal layer 240, and a common electrode 250. The pixel circuit 220 includes first, second, and third pixels PX1, PX2, and PX3. The first, second, and third pixels PX1, PX2, and PX3 respectively control the pixel electrodes 230 respectively disposed thereon.

The color filter 100b may color-convert portions of a third color light Lb into a first color light Lr and second color light Lg, the portions having been emitted from the backlight unit 300 and passed through the LCD panel 200, and then may externally emit the first color light Lr and the second color light Lg, and may externally emit another portion of the third color light Lb without color conversion.

In an exemplary embodiment, the bottom substrate 210 may include a glass material or a transparent plastic material, for example. A bottom polarizer (not shown) may be arranged on a bottom surface of the bottom substrate 210 so as to transmit only specifically-polarized light from among light emitted from the backlight unit 300. In an exemplary embodiment, the bottom polarizer may be a polarizing plate to transmit light that is linearly polarized in a first direction, for example.

The pixel circuit 220 may include a plurality of thin-film transistors ("TFTs") (not shown), and a gate line and a data line to respectively apply a gate signal and a data signal to the TFTs.

The pixel electrode 230 may be connected to a source electrode or a drain electrode of a TFT provided in the pixel circuit 220 and may receive a data voltage therefrom.

The common electrode 250 may be disposed above the planarization layer 160 of the color filter 100b. A top polarizer (not shown) may be arranged between the planarization layer 160 and the common electrode 250. The top polarizer may be a polarizing plate to transmit light that is linearly polarized in a second direction perpendicular to the first direction with respect to the linear polarization. However, the illustrated exemplary embodiment is exemplary, and the top polarizer and the bottom polarizer may transmit light that is polarized in a one direction.

The liquid crystal layer 240 is disposed between the pixel electrodes 230 and the common electrode 250, and an alignment of liquid-crystal particles included in the liquid crystal layer 240 is adjusted according to a voltage applied between the pixel electrodes 230 and the common electrode 250. That is, an area of the liquid crystal layer 240 between the pixel electrodes 230 and the common electrode 250 is controlled according to the voltage applied between the pixel electrodes 230 and the common electrode 250, so that the area of the liquid crystal layer 240 is controlled to an on-mode of changing polarization of incident light and an off-mode of not changing the polarization of the incident light. In addition, in-between grayscale expression may be achieved by adjusting a degree of the polarization of the incident light.

The third color light Lb that was controlled by the liquid crystal layer 240 above the first pixel PX1 passes through the upper color filter layer 150a and then is converted into the first color light Lr through the first CCL 140a, and after the first color light Lr passes through the first color filter layer 130a, only the first color light Lr having high color purity is externally emitted through the substrate 110. The third color light Lb that was controlled by the liquid crystal layer 240 above the second pixel PX2 passes through the upper color filter layer 150a and then is converted into the second color light Lg through the second CCL 140b, and after the second color light Lg passes through the second color filter layer 130b, only the second color light Lg having high color purity is externally emitted through the substrate 110.

After the third color light Lb that was controlled by the liquid crystal layer 240 above the third pixel PX3 passes through the upper color filter layer 150a, only the third color light Lb having high color purity is externally emitted through the substrate 110.

The color filter 100b includes the substrate 110, the first, second, and third pixel areas PA1, PA2, and PA3 (refer to FIG. 4) for providing different colors, the first color filter layer 130a and the first CCL 140a above the first pixel area PA1, the second color filter layer 130b and the second CCL 140b above the second pixel area PA2, and the upper color filter layer 150a on the third pixel area PA3. The color filter 100b may further include the light-blocking layer 120 on the light-blocking area BA (refer to FIG. 4) that surrounds the first, second, and third pixel areas PA1, PA2, and PA3.

The first CCL 140a is arranged above the first pixel area PA1, and converts the third color light Lb into the first color light Lr. The first color filter layer 130a includes a thin portion between the first CCL 140a and the substrate 110, and a thick portion surrounding side surface of the first CCL 140a. The first CCL 140a may be disposed in a groove of the first color filter layer 130a. The first color filter layer 130a may selectively transmit the first color light Lr and may block light of different colors.

The second CCL 140b is arranged above the second pixel area PA2, and converts the third color light Lb into the second color light Lg. The second color filter layer 130b includes a thin portion between the second CCL 140b and the substrate 110, and a thick portion surrounding side surface of the second CCL 140b. The second CCL 140b may be disposed in a groove of the second color filter layer 130b. The second color filter layer 130b may selectively transmit the second color light Lg and may block light of different colors.

The upper color filter layer 150a may selectively transmit the third color light Lb and may reflect light of different colors (e.g., the first color light Lr and the second color light Lg).

The third color light Lb emitted from the backlight unit 300 passes through the LCD panel 200 and then is incident on the color filter 100b while the third color light Lb is turned on or off according to a pixel area and image information. The color filter 100b color-converts portions of the third color light Lb into the first color light Lr and the second color light Lg, the portions having passed through the LCD panel 200, and then externally emits the first color light Lr and the second color light Lg, and externally emits another portion of the third color light Lb without color conversion, so that a color image is displayed.

Referring to FIG. 7, the LCD panel 200 is arranged between the backlight unit 300 and the color filter 100b, but the invention is not limited thereto, and in another exemplary embodiment, the color filter 100b may be disposed between the backlight unit 300 and the LCD panel 200.

Figure 8:
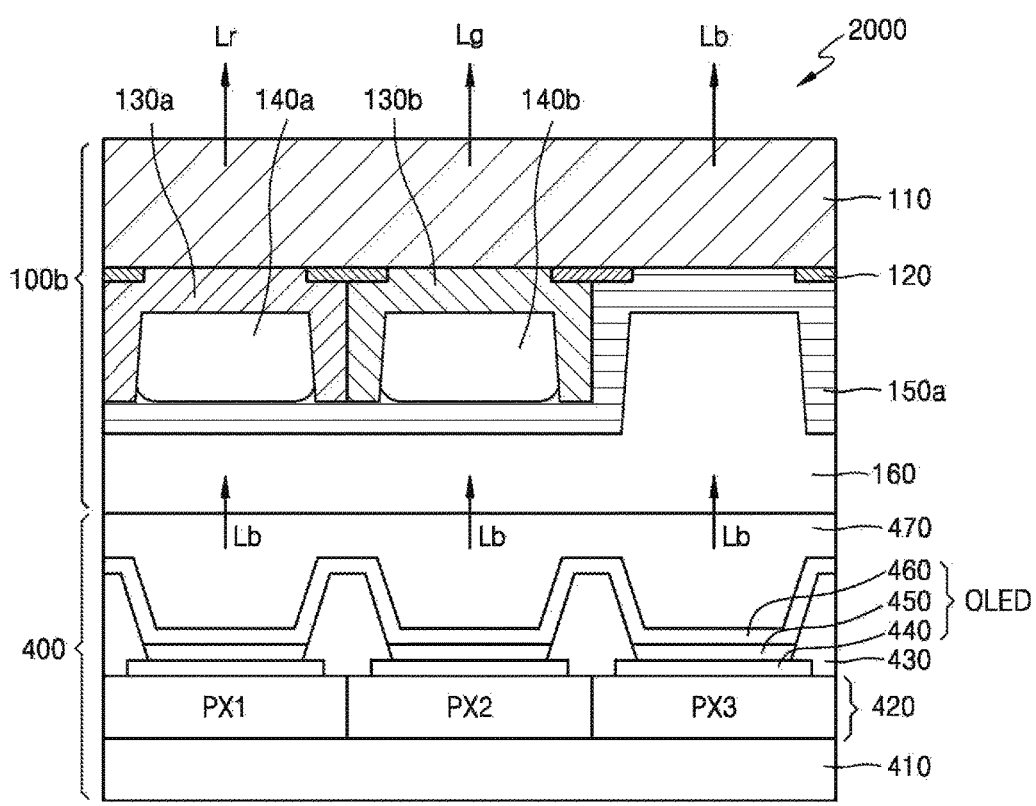
FIG. 8 is a cross-sectional view of another exemplary embodiment of a display device.

FIG. 8 is a cross-sectional view of a display device 2000, according to another exemplary embodiment.

Referring to FIG. 8, the display device 2000 includes an organic light-emitting display panel 400 and the color filter 100b.

The organic light-emitting display panel 400 includes first, second, and third pixels PX1, PX2, and PX3, and first, second, and third organic light-emitting devices OLED to be controlled by the first, second, and third pixels PX1, PX2, and PX3. The first, second, and third organic light-emitting devices OLED may each emit a third color light, e.g., blue light Lb, having emission intensity to be controlled by each of the first, second, and third pixels PX1, PX2, and PX3.

The color filter 100b may color-convert portions of the third color light Lb into a first color light Lr and second color light Lg, the portions being emitted from the first and second organic light-emitting devices OLED, and then may externally emit the first color light Lr and the second color light Lg, and may externally emit another portion of the third color light Lb without color conversion.

In another exemplary embodiment, the first, second, and third organic light-emitting devices OLED may emit ultraviolet light, for example, and in this case, the color filter 100c of FIG. 5 may be used instead of the color filter 100b.

In an exemplary embodiment, a substrate 410 may include a glass material, a metal material, an organic material, or the like, for example.

A pixel circuit layer 420 including first, second, and third pixels PX1, PX2, and PX3 is disposed on the substrate 410. The first, second, and third pixels PX1, PX2, and PX3 may each include a plurality of TFTs (not shown) and a storage capacitor (not shown), and in addition to the first, second, and third pixels PX1, PX2, and PX3, signal lines and power lines are arranged on the pixel circuit layer 420 so as to deliver signals and driving voltages to be applied to the first, second, and third pixels PX1, PX2, and PX3.

The TFTs may include a semiconductor layer, a gate electrode, a source electrode, and a drain electrode. In an exemplary embodiment, the semiconductor layer may include amorphous silicon or polycrystalline silicon, for example. In an exemplary embodiment, the semiconductor layer may include a semiconductor oxide, for example. The semiconductor layer includes a channel region, and source and drain regions doped with impurities.

Pixel electrodes 440 are disposed on the pixel circuit layer 420. The pixel electrode 440 may be connected to a source electrode or a drain electrode of a TFT. The pixel electrode 440 may be exposed through an opening of a pixel-defining layer 430, and side edges of the pixel electrode 440 may be covered with the pixel-defining layer 430.

An intermediate layer 450 is disposed on the pixel electrodes 440 exposed by the pixel-defining layer 430. The intermediate layer 450 may include an organic emission layer, and the organic emission layer may include a small molecule organic material or a polymer organic material. The intermediate layer 450 including the organic emission layer may selectively further include a functional layer such as a hole transport layer ("HTL"), a hole injection layer ("HIL"), an electron transport layer ("ETL"), an electron injection layer ("EIL"), or the like.

An opposite electrode 460 is arranged to cover the intermediate layer 450 and the pixel-defining layer 430.

The opposite electrode 460 may be a transparent electrode or a translucent electrode. In an exemplary embodiment, the opposite electrode 460 may include a metal thin film having a low work function, for example. In an exemplary embodiment, the opposite electrode 460 may include a transparent conductive oxide ("TCO"), for example.

The pixel electrode 440, the intermediate layer 450, and the opposite electrode 460 provide each of the first, second, and third organic light-emitting device OLED. An encapsulation layer 470 is arranged to cover the opposite electrode 460, thereby protecting the first, second, and third organic light-emitting devices OLED against external moisture or the like.

The third color light Lb that is emitted from the first organic light-emitting device OLED controlled by the first pixel PX1 passes through the upper color filter layer 150*a* and then is converted into the first color light Lr through the first CCL 140*a*, and after the first color light Lr passes through the first color filter layer 130*a*, only the first color light Lr having high color purity is externally emitted through the substrate 110. The third color light Lb that is emitted from the second organic light-emitting device OLED controlled by the second pixel PX2 passes through the upper color filter layer 150*a* and then is converted into the second color light Lg through the second CCL 140*b*, and after the second color light Lg passes through the second color filter layer 130*b*, only the second color light Lg having high color purity is externally emitted through the substrate 110. After the third color light Lb that is emitted from the third organic light-emitting device OLED controlled by the third pixel PX3 passes through the upper color filter layer 150*a*, only the third color light Lb having high color purity is externally emitted through the substrate 110.

The color filter 100*b* includes the substrate 110, the first, second, and third pixel areas PA1, PA2, and PA3 (refer to FIG. 4) for providing different colors, the first color filter layer 130*a* and the first CCL 140*a* above the first pixel area PA1, the second color filter layer 130*b* and the second CCL 140*b* above the second pixel area PA2, and the upper color filter layer 150*a* on the third pixel area PA3. The color filter 100*b* may further include the light-blocking layer 120 on the light-blocking area BA (refer to FIG. 4) that surrounds the first, second, and third pixel areas PA1, PA2, and PA3.

The first CCL 140*a* is arranged above the first pixel area PA1, and converts the third color light Lb into the first color light Lr. The first color filter layer 130*a* includes a thin portion between the first CCL 140*a* and the substrate 110, and a thick portion surrounding side surface of the first CCL 140*a*. The first CCL 140*a* may be disposed in a groove of the first color filter layer 130*a*. The first color filter layer 130*a* may selectively transmit the first color light Lr and may block light of different colors.

The second CCL 140*b* is arranged above the second pixel area PA2, and converts the third color light Lb into the second color light Lg. The second color filter layer 130*b* includes a thin portion between the second CCL 140*b* and the substrate 110, and a thick portion surrounding side surface of the second CCL 140*b*. The second CCL 140*b* may be disposed in a groove of the second color filter layer 130*b*. The second color filter layer 130*b* may selectively transmit the second color light Lg and may block light of different colors.

The upper color filter layer 150*a* may selectively transmit the third color light Lb and may reflect light of different colors (e.g., the first color light Lr and the second color light Lg).

The third color light Lb emitted from the organic light-emitting display panel 400 is incident on the color filter 100*b*. The color filter 100*b* color-converts portions of the incident third color light Lb into the first color light Lr and the second color light Lg, and then externally emits the first color light Lr and the second color light Lg, and externally emits another portion of the third color light Lb without color conversion, so that a color image is displayed.

Referring to FIG. 8, the color filter 100*b* is disposed on the organic light-emitting display panel 400. However, when the organic light-emitting display panel 400 corresponds to a bottom emission type, the organic light-emitting display panel 400 may be disposed on the color filter 100*b*.

According to the exemplary embodiments, a color filter layer having a groove shape is provided and then a CCL is disposed in the groove by an inkjet coating method, so that a manufacturing process may be simplified. In addition, different color filters are arranged between adjacent CCLs, so that it is possible to prevent an occurrence of color mixing in the adjacent CCLs. Accordingly, a display device having improved color reproduction may be manufactured through the simple manufacturing process.

While one or more exemplary embodiments have been described with reference to the figures, it will be understood by one of ordinary skill in the art that various changes in form and details may be made therein without departing from the spirit and scope as defined by the following claims.

What is claimed is:

1. A color filter comprising:
   a substrate including a first pixel area and a light-blocking area surrounding the first pixel area;
   a first color conversion layer above the first pixel area and converting incident light into a first color light; and
   a first color filter layer including a first portion between the first color conversion layer and the substrate, and a second portion which surrounds side surfaces of the first color conversion layer, and the first color filter layer selectively transmits the first color light,
   wherein the second portion has a thickness greater than that of the first portion.

2. The color filter of claim 1, wherein the first color conversion layer comprises first quantum dots which emit the first color light which is excited by the incident light and thus has a wavelength longer than that of the incident light.

3. The color filter of claim 1, further comprising a light-blocking layer between the substrate and the second portion.

4. The color filter of claim 1, further comprising an upper color filter layer which is disposed above the first color conversion layer and the first color filter layer, reflects the first color light and selectively transmits the incident light.

5. The color filter of claim 4, wherein
the substrate includes a second pixel area separated from the first pixel area by the light-blocking area, and
the upper color filter layer arranged above the second pixel area and on a sidewall of the second portion adjacent to the second pixel area.

6. The color filter of claim 1, wherein the first portion and the second portion are unitary.

7. The color filter of claim 1, wherein the incident light is one of blue light and ultraviolet light, and a first color of the first color light is one of a red color and a green color.

8. The color filter of claim 1, further comprising:
a second color conversion layer above a second pixel area of the substrate and converting the incident light into second color light different from the first color light; and
a second color filter layer including a first portion between the second color conversion layer and the substrate and a second portion which surrounds side surfaces of the second color conversion layer, and selectively transmits the second color light.

9. The color filter of claim 8, wherein the first color filter layer blocks transmission of the second color light, and the second color filter layer blocks transmission of the first color light.

10. The color filter of claim 8, further comprising:
a third color conversion layer above a third pixel area of the substrate and converting the incident light into third color light different from the first color light and the second color light; and
a third color filter layer including a first portion between the third color conversion layer and the substrate and a second portion which surrounds side surfaces of the third color conversion layer, and selectively transmits the third color light.

11. A method of manufacturing a color filter, the method comprising:
arranging a substrate including a first pixel area and a light-blocking area surrounding the first pixel area;
disposing, on the substrate, a first material layer capable of selectively transmitting a first color light;
disposing, by removing portions of the first material layer, a first color filter layer including a first portion on the first pixel area and a second portion on the light-blocking area, the second portion having a thickness greater than that of the first portion; and
disposing, on the first portion, a first color conversion layer capable of converting incident light into the first color light.

12. The method of claim 11, wherein the first color conversion layer is disposed on the first portion of the first color conversion layer by an inkjet coating method.

13. The method of claim 11, further comprising disposing a light-blocking layer on the light-blocking area.

14. The method of claim 11, further comprising disposing, above the first color conversion layer and the first color filter layer, an upper color filter layer capable of reflecting the first color light and selectively transmitting the incident light.

15. The method of claim 14, wherein the upper color filter layer is disposed above a second pixel area of the substrate and on a sidewall of the second portion adjacent to the second pixel area.

16. The method of claim 11, further comprising
disposing, on the substrate, a second material layer capable of selectively transmitting a second color light;
disposing, by removing portions of the second material layer, a second color filter layer which includes a first portion on a second pixel area of the substrate and a second portion on the light-blocking area, the second portion of the second color filter layer having a thickness greater than that of the first portion of the second color filter layer; and
disposing, on the first portion of the second color filter layer, a second color conversion layer capable of converting the incident light into the second color light.

17. A display device comprising:
a display comprising first and second pixels; and
a color filter above the display, and including first and second pixel areas arranged to overlap the first and second pixels, respectively,
wherein the color filter comprises:
a substrate including the first and second pixel areas;
a first color conversion layer which is disposed above the first pixel area and converts incident light into a first color light;
a second color conversion layer which is disposed above the second pixel area and converts the incident light into a second color light;
a first color filter layer including a first portion between the first color conversion layer and the substrate, and a second portion which surrounds side surfaces of the first color conversion layer, and the first color filter layer selectively transmits the first color light; and
a second color filter layer including a first portion between the second color conversion layer and the substrate and a second portion which surrounds side surfaces of the second color conversion layer, and the second color filter layer selectively transmits the second color light,
wherein the second portion of the first and second color filter layers have a thickness greater than that of the first portion of the first and second color filter layers.

18. The display device of claim 17, further comprising:
a backlight unit which emits the incident light to the color filter; and
a liquid-crystal layer between the display and the color filter.

19. The display device of claim 17, wherein each of the first and second pixels comprises an organic emission layer capable of emitting the incident light.

* * * * *